US008973496B2

(12) United States Patent
Sumioka et al.

(10) Patent No.: US 8,973,496 B2
(45) Date of Patent: Mar. 10, 2015

(54) SCREEN PRINTING MACHINE

(71) Applicant: Yamaha Hatsudoki Kabushiki Kaisha, Shizuoka-ken (JP)

(72) Inventors: Koichi Sumioka, Shizuoka (JP); Mitsuharu Morita, Shizuoka (JP)

(73) Assignee: Yamaha Hatsudoki Kabushiki Kaisha, Shizuoka-ken (JP)

( * ) Notice: Subject to any disclaimer, the term of this patent is extended or adjusted under 35 U.S.C. 154(b) by 0 days.

(21) Appl. No.: 13/935,240

(22) Filed: Jul. 3, 2013

(65) Prior Publication Data

US 2014/0020578 A1 Jan. 23, 2014

(30) Foreign Application Priority Data

Jul. 23, 2012 (JP) ................. 2012-162731

(51) Int. Cl.
| | | |
|---|---|---|
| B41F 15/08 | (2006.01) | |
| B41L 13/18 | (2006.01) | |
| B41F 15/44 | (2006.01) | |
| B41F 35/00 | (2006.01) | |
| H05K 3/12 | (2006.01) | |
| H05K 3/34 | (2006.01) | |

(52) U.S. Cl.
CPC .............. B41F 15/44 (2013.01); B41F 35/003 (2013.01); H05K 3/1216 (2013.01); H05K 2203/0139 (2013.01); H05K 3/3484 (2013.01)
USPC .......................................... 101/123; 101/126

(58) Field of Classification Search
USPC ......................................... 101/123, 126, 127
See application file for complete search history.

(56) References Cited

U.S. PATENT DOCUMENTS

| | | | | |
|---|---|---|---|---|
| 4,121,519 | A * | 10/1978 | Porth | 101/124 |
| 4,628,814 | A | 12/1986 | Klemm | |
| 4,966,020 | A * | 10/1990 | Fotheringham et al. | 70/276 |
| 5,044,306 | A * | 9/1991 | Erdmann | 118/120 |
| 6,494,133 | B2 * | 12/2002 | Ooe | 101/123 |
| 6,564,708 | B2 * | 5/2003 | Murakami | 101/123 |
| 7,337,717 | B2 * | 3/2008 | Chen et al. | 101/123 |
| 7,503,255 | B2 * | 3/2009 | Weber et al. | 101/123 |
| 2006/0243144 | A1 * | 11/2006 | Murakami | 101/123 |
| 2009/0133208 | A1 | 5/2009 | Curtin | |
| 2009/0199731 | A1 | 8/2009 | Pisarski | |

(Continued)

FOREIGN PATENT DOCUMENTS

| | | |
|---|---|---|
| JP | S60-155459 A | 8/1985 |
| JP | H06-210827 A | 8/1994 |

(Continued)

OTHER PUBLICATIONS

Machine Translation of JP11-105244 published Apr. 20, 1999.*

(Continued)

*Primary Examiner* — Ren Yan
*Assistant Examiner* — Marissa Ferguson Samreth
(74) *Attorney, Agent, or Firm* — Studebaker & Brackett PC

(57) ABSTRACT

A screen printing machine including: a screen mask 1 detachably mounted to a mask mounting area set in advance; a squeegee, which is arranged above the screen mask mounted to the mask mounting area, and the squeegee reciprocates relative to the screen mask in a squeegee-movement direction; and a receptacle which is installed at a location so that the screen mask is allowed to be attached and detached and which catches applying material adhered to the squeegee.

9 Claims, 18 Drawing Sheets

(56) References Cited

U.S. PATENT DOCUMENTS

| | | | |
|---|---|---|---|
| 2010/0000428 A1* | 1/2010 | Chen | 101/123 |
| 2011/0252988 A1* | 10/2011 | Tanaka et al. | 101/129 |

FOREIGN PATENT DOCUMENTS

| | | |
|---|---|---|
| JP | H08-187928 A | 7/1996 |
| JP | H10-157066 A | 6/1998 |
| JP | H11-105244 A | 4/1999 |
| JP | H11-198347 A1 | 7/1999 |
| JP | H11-235809 A | 8/1999 |
| JP | H11-268244 A | 10/1999 |
| JP | 2006-305822 A | 11/2006 |
| JP | 2008-105294 A | 5/2008 |
| JP | 2009-184357 A | 8/2009 |
| JP | 2011-255630 A | 12/2011 |

OTHER PUBLICATIONS

The extended European search report issued on Dec. 9, 2013, which corresponds to EP 13003574.4-1803 and is related to U.S. Appl. No. 13/935,240.

An Office Action; "Notice of Reasons for Refusal," issued by the Japanese Patent Office on Jun. 3, 2014, which corresponds to Japanese Patent Application No. 2012-162731 and is related to U.S. Appl. No. 13/935,240; with English language translation.

An Office Action issued by the Korean Patent Office on Aug. 22, 2014, which corresponds to Korean Patent Application No. 10-2013-0085963 and is related to U.S. Appl. No. 13/935,240; with English language summary.

* cited by examiner

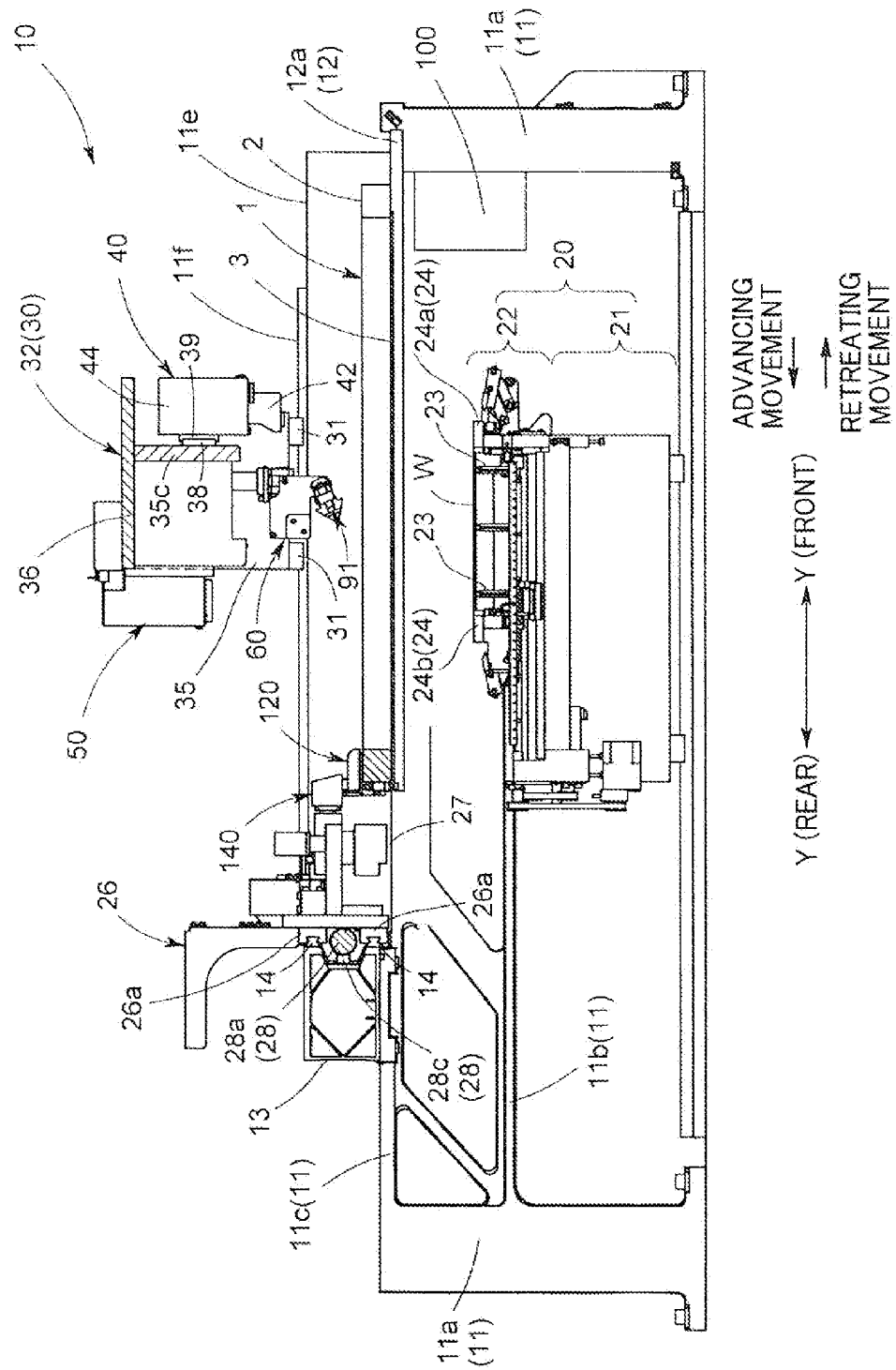

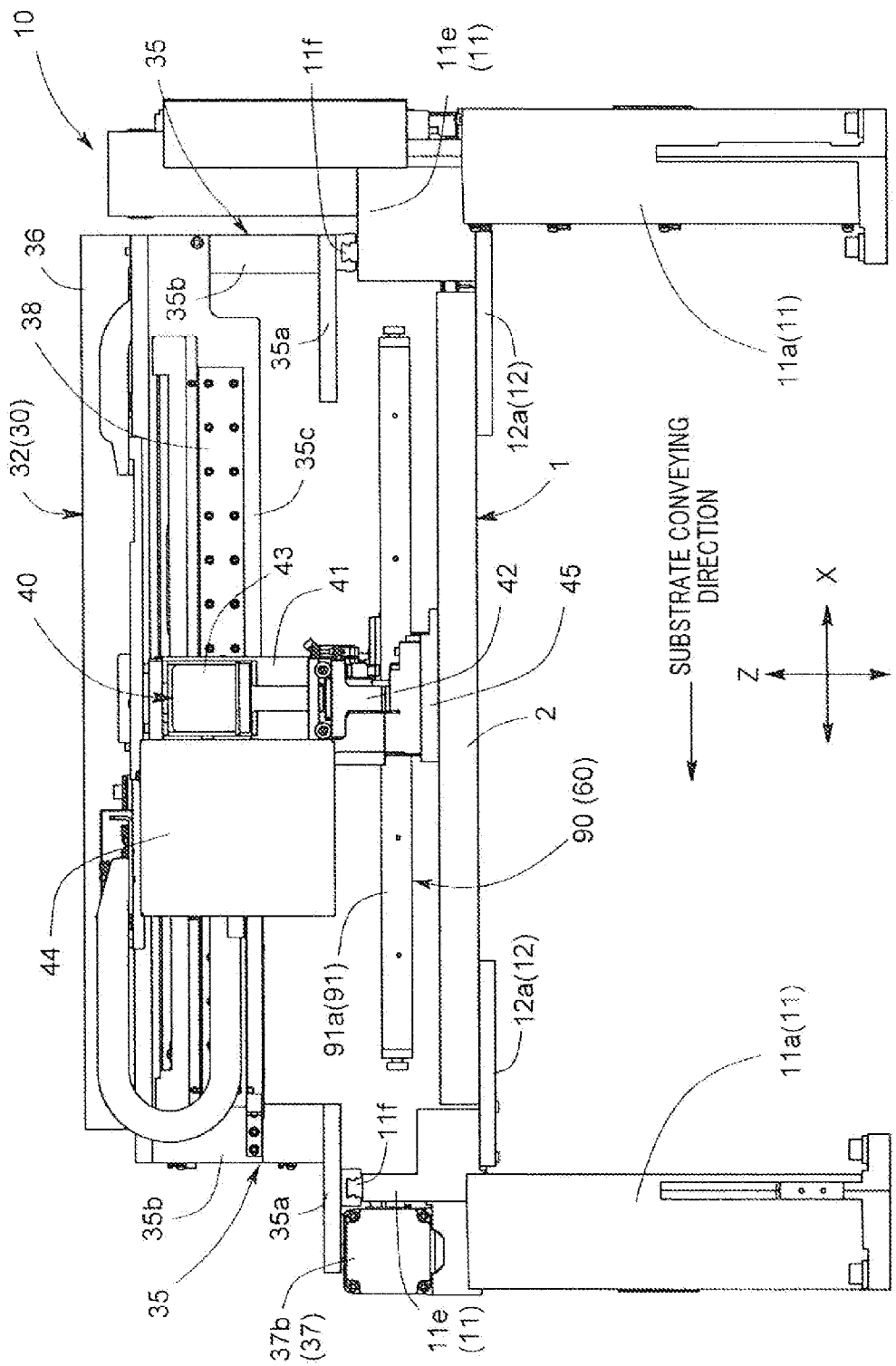

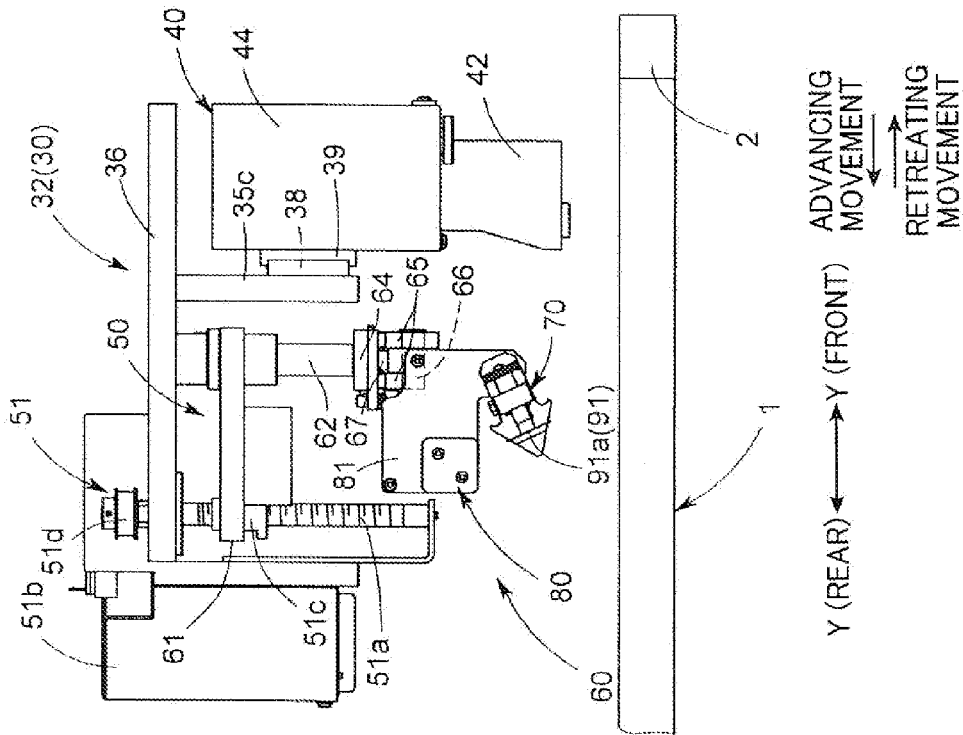
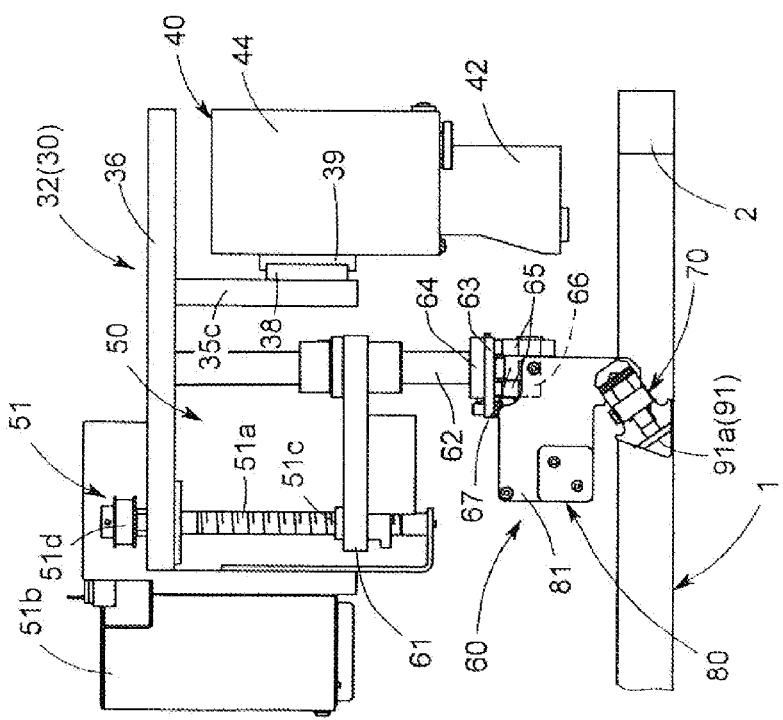

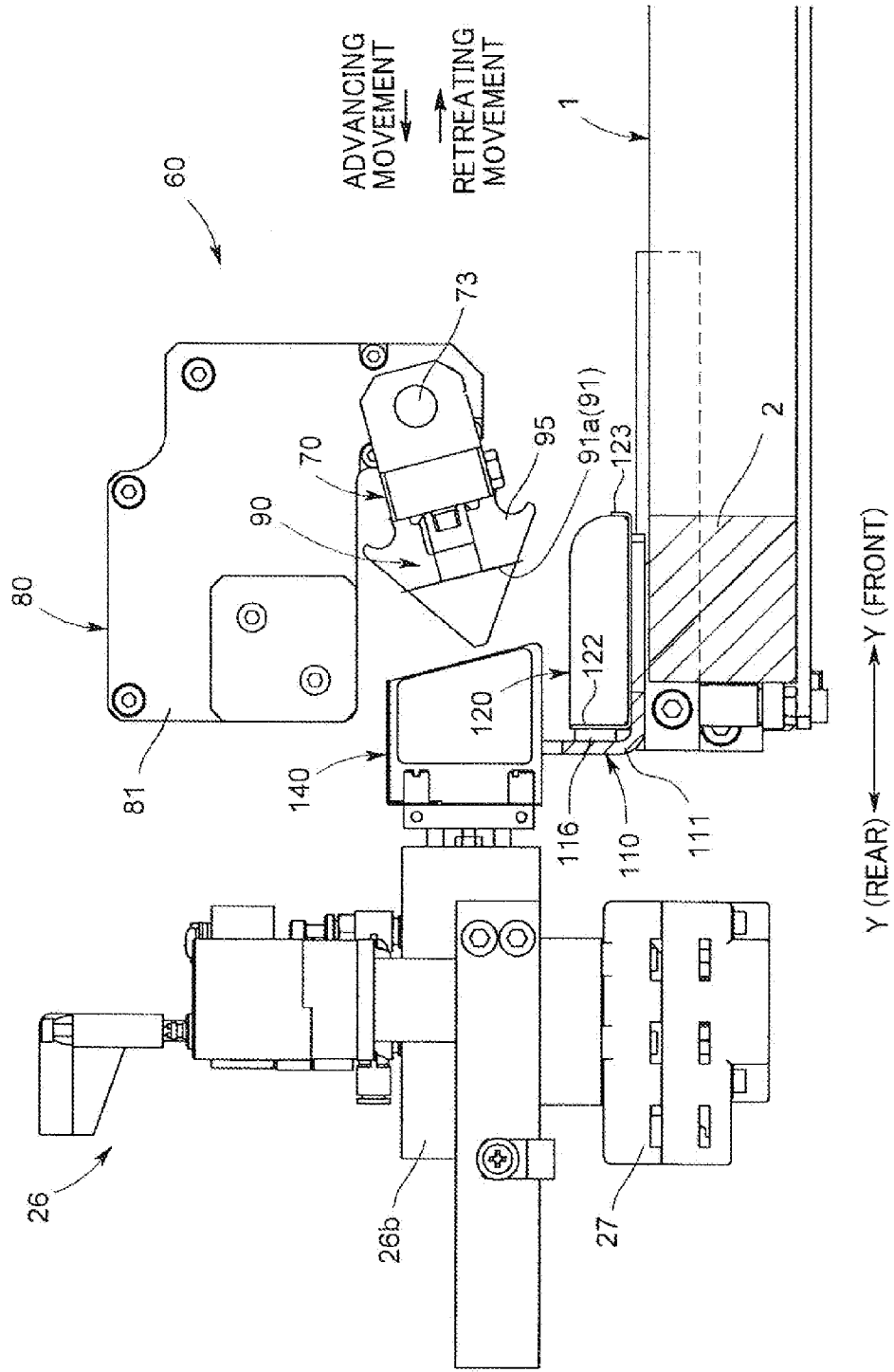

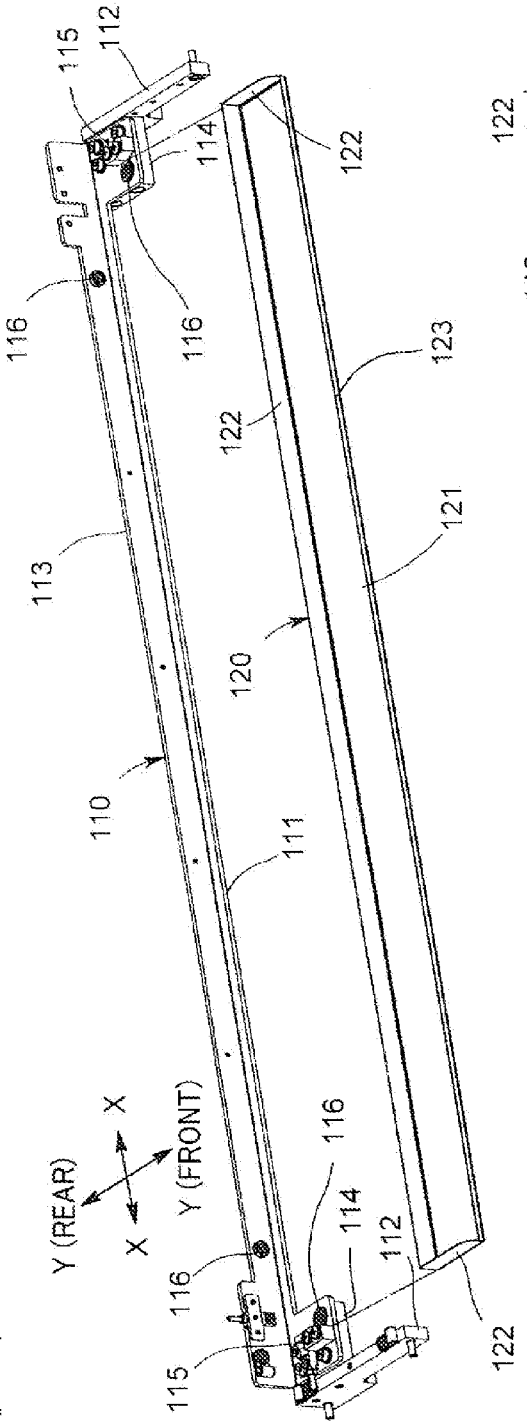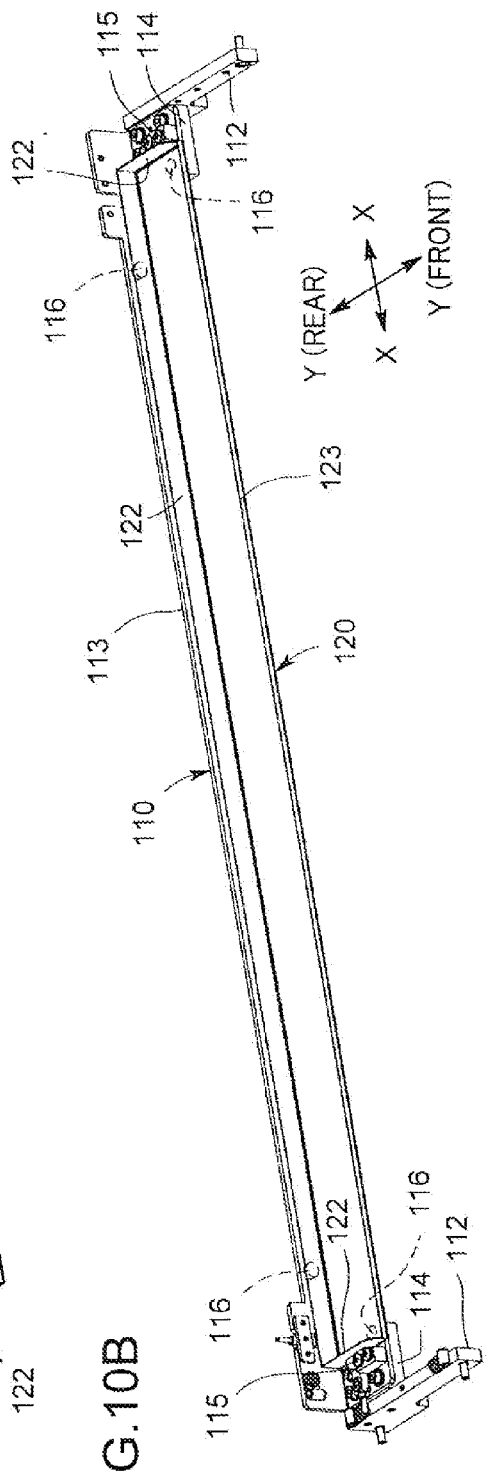
FIG.10A
FIG.10B

SCREEN PRINTING MACHINE

BACKGROUND OF THE INVENTION

1. Field of the Invention

The present invention relates to a screen printing machine, and more particularly, to a screen printing machine which screen-prints applying material such as a cream solder or a conductive paste on a substrate such as a printed wiring board (PWB) or a printed circuit board (PCB) as a pretreatment for mounting an electronic component to the substrate.

2. Description of the Related Art

For example, as disclosed in Japanese Patent Application Laid-open No. 2008-105294 (hereinafter, "Patent Document 1"), a screen printing machine includes a screen mask in which a print pattern is formed, and a squeegee. The screen mask is mounted to a predetermined mask mounting area. In a printing process, the squeegee moves over the screen mask relative to the screen mask. Applying material supplied to the screen mask is rolled by the squeegee and applied to a substrate through a print pattern. The print pattern of a screen mask corresponds to each substrate. Therefore, when a substrate that is a production object is changed, a screen mask is also changed. Conventionally, as expressively described in Patent Document 1, a change of screen masks necessitates replacement of squeegees.

Conventionally, replacement work of a screen mask required attaching and detaching a squeegee even when changing the squeegee was not required. In other words, applying material is adhered to a squeegee immediately after use. Therefore, a state exists where the applying material adhered to the squeegee is more likely to drip down into a mask mounting area. On the other hand, a substrate conveying mechanism and a substrate supporting mechanism are facing the mask mounting area. When the applying material drips onto these mechanisms, there is a risk that a substrate may become dirty or operations of the mechanisms may be obstructed. Therefore, conventionally, processes involving replacing a screen mask inevitably require that the squeegee be removed in advance. As a result, preparation work is time-consuming. In addition, the versatility of squeegees cannot be fully utilized.

SUMMARY OF THE INVENTION

The present invention has been made in consideration of the problems described above, and an object thereof is to provide a screen printing machine capable of reducing preparation work and utilizing the versatility of a squeegee.

In order to solve the problems described above, the present invention is a screen printing machine that prints applying material on a substrate, the screen printing machine including: a screen mask detachably mounted to a mask mounting area set in advance; a squeegee that is arranged above the screen mask mounted to the mask mounting area, and the squeegee reciprocates relative to the screen mask in a squeegee-movement direction set in advance; and a receptacle which is installed at a location so that the screen mask is allowed to be attached and detached and which catches applying material adhered to the squeegee. In this mode, attachment/detachment work of a screen mask can be executed while catching applying material which may drip from the squeegee into the receptacle when attaching or detaching the screen mask. Therefore, the applying material adhered to the squeegee does not involuntarily drip into the mask mounting area during attaching or detaching of the screen mask. In addition, the catching of applying material is executed at the location so that the screen mask is allowed to be attached and detached. Therefore, replacement work of a screen mask can be executed while catching the applying material on the squeegee into the receptacle. As a result, the screen mask can be replaced while leaving the squeegee is mounted. Accordingly, attachment/detachment work of a screen mask during replacement is dramatically simplified and preparation work becomes easier. In addition, the versatility of a squeegee can be effectively utilized.

As described above, according to the present invention, the screen mask can be replaced while leaving the squeegee is mounted. Accordingly, attachment/detachment work during replacement of the screen mask is dramatically simplified and preparation work becomes easier. In addition, the versatility of a squeegee can be effectively utilized.

Other features, objects, configurations, and operational advantages of the present invention will be readily appreciated from the following detailed description when considered in connection with the accompanying drawings.

BRIEF DESCRIPTION OF THE DRAWINGS

FIG. 4 is a side view showing a schematic configuration of the screen printing machine;

FIG. 5 is a schematic front view of the screen printing machine;

FIG. 6A is a schematic side view showing a schematic configuration of an assembly of a traveling unit, a lifting unit, a supplying unit, and a print head during lowering of the print head of the screen printing machine;

FIG. 6B is a schematic side view showing a schematic configuration of the assembly of the traveling unit, the lifting unit, the supplying unit, and the print head during lifting of the print head of the screen printing machine;

FIG. 9 is a partial schematic side view showing an enlargement of a substantial part of the screen printing machine;

FIG. 10A is an exploded perspective view showing a configuration regarding a receptacle of the screen printing machine;

FIG. 10B is an assembly perspective view showing a configuration regarding the receptacle of the screen printing machine;

DESCRIPTION OF THE PREFERRED EMBODIMENTS

Figure 1:
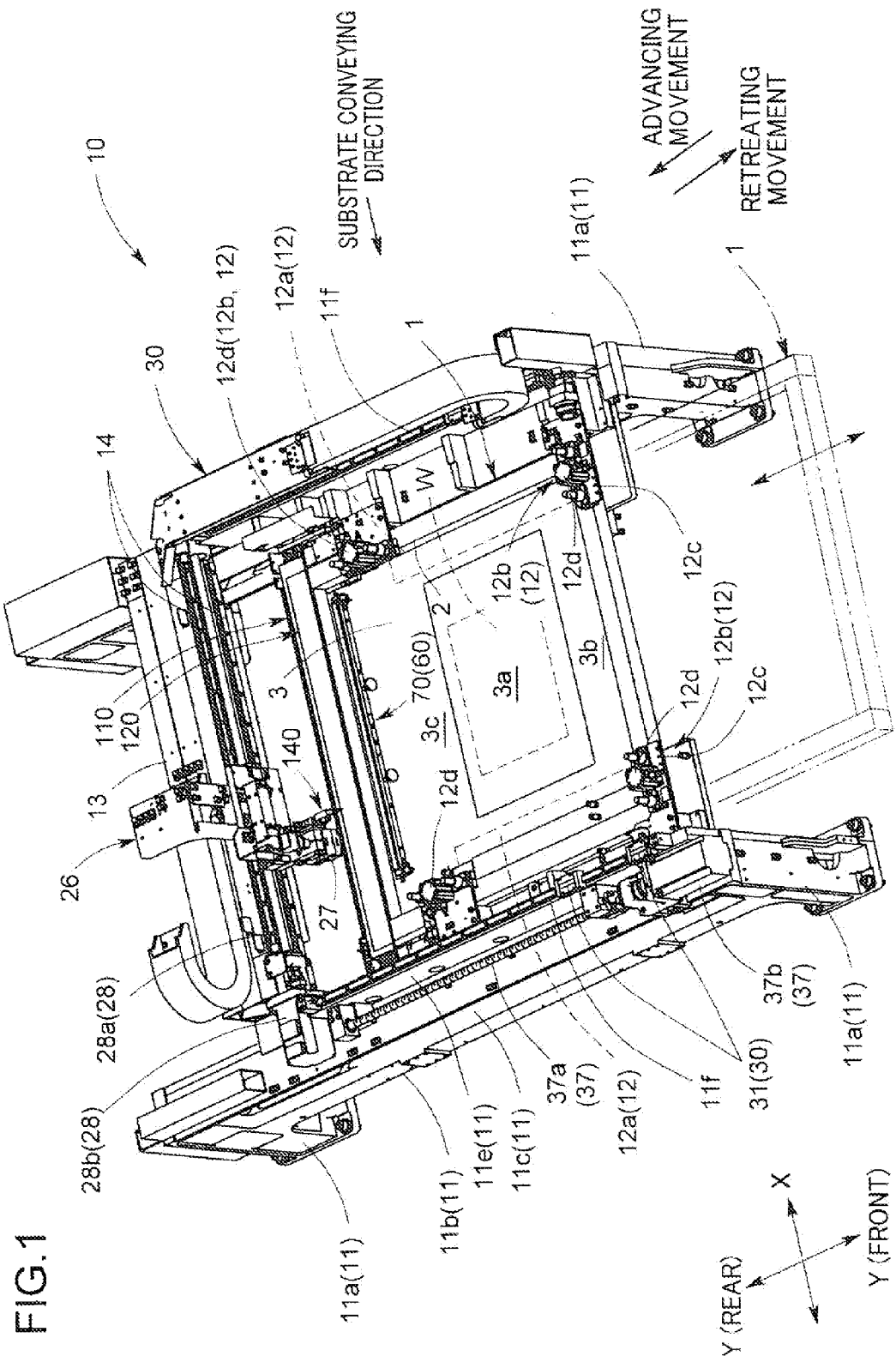
FIG. 1 is a perspective view of a screen printing machine according to a first embodiment of the present invention.

Hereinafter, preferable modes for carrying out the present invention will be described with reference to the accompanying drawings. Moreover, in the respective embodiments described below, common members will be designated by same reference numerals and redundant descriptions will be omitted.

First Embodiment

Figure 2:
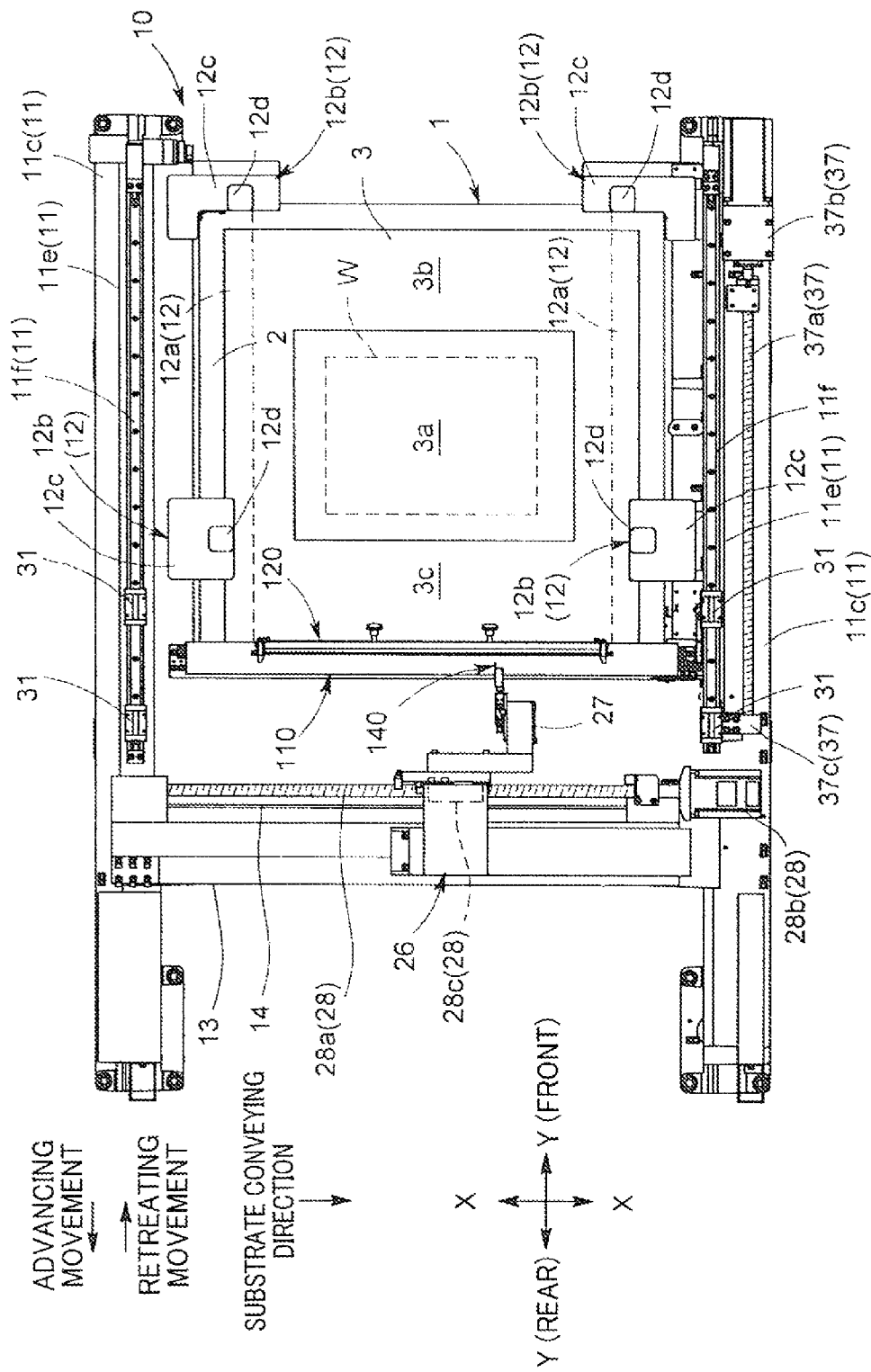
FIG. 2 is a schematic plan view of the screen printing machine in a state where a screen mask is installed.

FIG. 1 is a perspective view showing a schematic configuration of a screen printing machine 10 according to a first embodiment of the present invention. FIG. 2 is a schematic plan view of the screen printing machine 10 in a state where a screen mask 1 is installed. A print substrate W or a processing object is conveyed in leftward and rightward directions of the screen printing machine 10. In the following description, a direction in a conveying direction of the substrate W when conveyed as mentioned above will be assumed to be an X-axis direction and forward and backward directions of the screen printing machine 10 will be assumed to be a Y-axis direction.

Referring to FIGS. 1 and 2, the screen mask 1 has a frame 2 with four corners and a mask sheet 3 provided in tension on the frame 2. A print area 3a is formed in an approximately central portion of the mask sheet 3. The print area 3a is a rectangular area which fits the print substrate W that is a print object. A pattern which conforms to a corresponding print substrate W is formed in the print area 3a. The pattern is formed of pores. Applying material such as a cream solder or a conductive paste is supplied to the print area 3a. When the applying material is pressed into the print area 3a, the applying material is transferred to the print substrate W via the pattern. Moreover, in the following description, an area on a front side of the print area 3a will be referred to as a front outside-of-print area 3b, and an area on a rear side of the print area 3a will be referred to as a rear outside-of-print area 3c.

The screen mask 1 is detachably mounted to the screen printing machine 10 by an operator.

The screen printing machine 10 has a base 11. The base 11 is a structure that is rectangular in plan view. Legs 11a are provided at four corners of the base 11. The base 11 also has lower beams 11b which couple front and rear legs 11a with each other, and upper beams 11c which couple the front and rear legs 11a with each other above the lower beams 11b. The lower beams 11b and the upper beams 11c are respectively provided to the left and the right of the base 11. Conveying paths which convey the print substrate W in the X-axis direction are respectively formed between the lower beams 11b and the upper beams 11c.

A mask supporting mechanism 12 which supports the screen mask 1 is provided on the upper beams 11c of the base 11. Along a longitudinal direction of each of the upper beams 11c, the mask supporting mechanism 12 includes a mask receiving plate 12a extended on an inner side of the upper beam 11c and a clamp unit 12b provided in an upper part of the mask receiving plate 12a (the four corners of the base 11).

Figure 3:
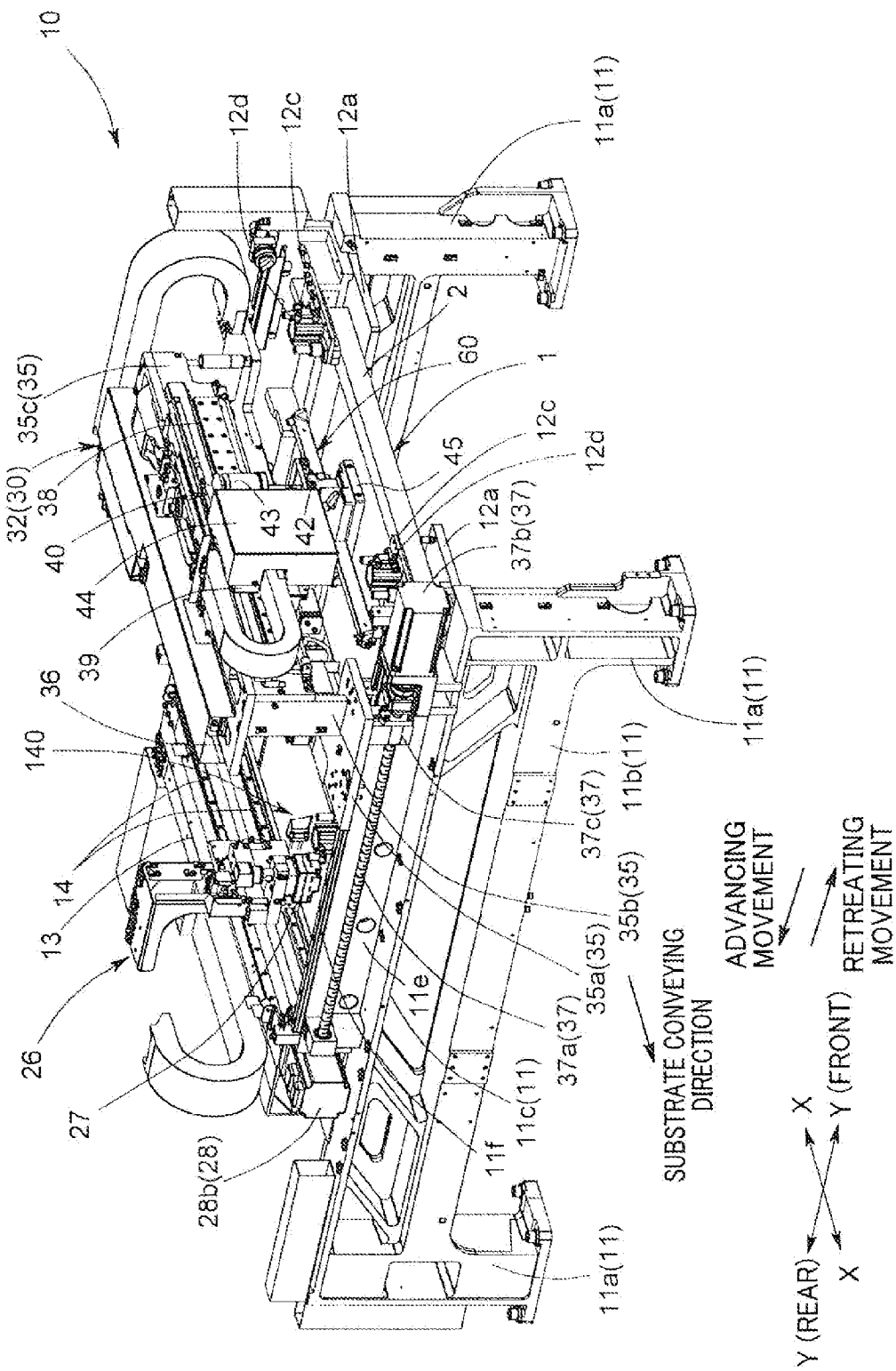
FIG. 3 is a perspective view showing the screen printing machine from a different angle.

As shown in FIGS. 3 to 5, each of the mask receiving plates 12a face each other at an interval set in advance in the X-axis direction and extend horizontally in the Y-axis direction at a same height. The mask receiving plates 12a are, respectively, members for receiving a lower surface of the frame 2 of the screen mask 1. A stopper (not shown) for positioning the frame 2 of the screen mask 1 is provided at a lower end of the mask receiving plate 12a.

The clamp unit 12b of the mask supporting mechanism 12 has a stay 12c fixed to the upper beam 11c and an air cylinder 12d mounted to the stay 12c. The stay 12c is arranged at the four corners of the base 11 (refer to FIG. 1). Each stay 12c faces a corresponding mask receiving plate 12a from above or below across a predetermined gap. Therefore, a space for inserting or removing the screen mask 1 forward or backward is formed between the mask receiving plates 12a and the stays 12c. Accordingly, by inserting the screen mask 1 from the front of the screen printing machine 10 and positioning the screen mask 1 by the stopper, the screen mask 1 is mounted to a mask mounting area (an area in which the screen mask 1 is installed in FIG. 2) defined by the base 11. The air cylinders 12d provided on the respective stays 12c are arranged with each of their rods facing downward. Besides being controlled by a control unit 100 (to be described later), the air cylinders 12d can be operated from an operating panel (not shown). Due to the control or operation described above, the air cylinders 12d are switched between a clamp state where the rods are extended and a clamp release state where the rods are contracted. The mask receiving plate 12a and the clamp unit 12b constitute the mask supporting mechanism 12. Due to the mask supporting mechanism 12, the screen mask 1 is detachably mounted to the mask mounting area.

Substrate conveying conveyors (not shown) are installed on both sides of the base 11 in the X-axis direction. One substrate conveying conveyor constitutes a carry-in conveyor which carries the print substrate W into the base 11, and the other substrate conveying conveyor constitutes a carry-out conveyor which carries out the print substrate W from the base 11. A print stage 20 is installed in the base 11. The print stage 20 receives the substrate W from the carry-in conveyor, and lifts the substrate W onto a lower surface of the mask sheet 3 according to a procedure set in advance. In addition, after a printing process is completed, the print stage 20 lowers the substrate W from the lower surface of the mask sheet 3 and hands over the substrate W to the carry-out conveyor.

Referring to FIG. 4, the print stage 20 includes a quadruple axes unit 21 and a substrate supporting unit 22 arranged above the quadruple axes unit 21.

The quadruple axes unit 21 hierarchically includes a plurality of table mechanisms with different directions of movement. By combining these table mechanisms, the quadruple axes unit 21 supports the print substrate W carried in by the carry-in conveyor so as to be displaceable in directions of the X axis, the Y axis, a Z axis, and an R axis (rotation around the Z axis) while keeping the print substrate W horizontal. Each table mechanism of the quadruple axes unit 21 includes motors. The motors of the respective table mechanisms are controlled by the control unit 100 (to be described later). Due to control by the control unit 100, the quadruple axes unit 21 is configured so as to be capable of moving the print substrate W supported by the quadruple axes unit 21 to a position where a camera unit 26 arranged on a left hand-side in FIG. 4 is able to capture an image of the print substrate W.

The substrate supporting unit 22 includes a plurality of support pins 23 which receives a lower surface of the print substrate W, and a clamp unit 24 which clamps the print substrate W supported by the support pins 23. The support pins 23 are mounted so as to be ascendable and descendable relative to the quadruple axes unit 21. The clamp unit 24 is provided with a fixed portion 24a which is fixed to the quadruple axes unit 21 and a movable portion 24b which is capable of moving in the Y-axis direction relative to the fixed portion 24a. Conveyor belts which form a pair to carry in or carry out the print substrate W in the X-axis direction are respectively mounted to upper ends of the fixed portion 24a and the movable portion 24b. A position of the movable portion 24b is adjusted in correspondence with a dimension of the print substrate W in the Y-axis direction. When the print substrate W is carried onto the conveyor belt of the clamp unit 24 from the carry-in conveyor, the respective support pins 23 of the substrate supporting unit 22 protrude and support the print substrate W from a lower side thereof (a rear surface thereof). Then, the print substrate W is clamped by the clamp unit 24 in the Y-axis direction. Accordingly, the print substrate W is to be fixed in a state where the print substrate W is positioned with respect to the substrate supporting unit 22. In addition, due to the lifting/lowering function of the quadruple axes unit 21, the print substrate W carried by the substrate supporting unit 22 is capable of ascending and descending between two positions: an overlay mount position to which the print substrate W is lifted between both mask receiving plates 12a of the mask supporting mechanism 12 and at which the print substrate W is overlay-mounted on the mask sheet 3 of the screen mask 1; and a carry-out/carry-in position to which the print substrate W is lowered from the overlay mount position and at which the print substrate W is supplied to the substrate carry-in conveyor or the substrate carry-out conveyor.

A mask camera (not shown) is provided on the print stage 20. The mask camera is an example of an imaging unit. The mask camera captures images of a plurality of fiducial marks (not shown) on the lower surface of the screen mask 1 supported by the mask supporting mechanism (to be described later). An image captured by the mask camera is processed by the control unit 100 as information for identifying a position, a type, or the like of the screen mask 1. The mask camera is provided on the print stage 20 so as to be movable in the X-axis direction. In addition, due to the quadruple axes unit 21 of the print stage 20 being movable in the Y-axis direction, the mask camera is capable of capturing images of a plurality of fiducial marks or the like separated from each other in both the X-direction and the Y-direction and recognizing the positions of the fiducial marks or the like.

Moreover, since further configurations, operational advantages, and the like of the print stage 20 are disclosed in detail in, for example, Japanese Patent Application No. 2009-27310 (Japanese Patent Application Laid-open No. 2010-179628) previously submitted by the present applicant, a further description will be omitted.

Figure 11:
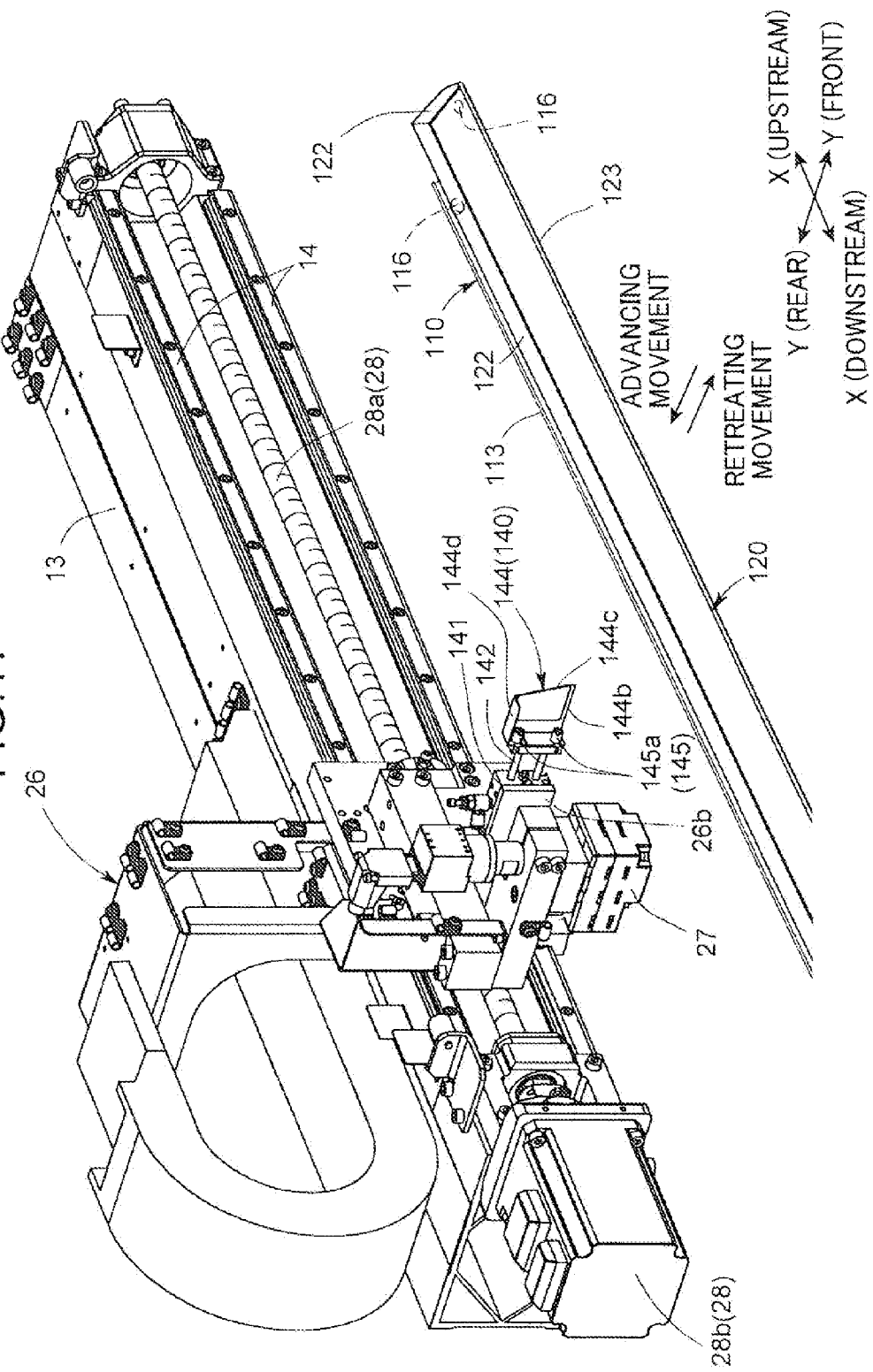
FIG. 11 is a perspective view showing a configuration regarding a camera unit of the screen printing machine.

Next, referring to FIGS. 1, 2, and 11, a beam 13 extending in the X-axis direction is provided in a rear end portion of the base 11. The beam 13 is placed laterally on an upper part of a rear end of the upper beam 11c of the base 11. A pair of rails 14 that is vertically aligned is fixed to a side portion of the beam 13. A slider 26a (refer to FIG. 4) of the camera unit 26 is coupled to the rails 14. In addition, a ball screw mechanism 28 is provided on the beam 13. The ball screw mechanism 28 includes a ball screw 28a which is arranged between the rails 14 and which extends in the X-axis direction, a motor 28b which drives the ball screw 28a, and a nut 28c (refer to FIG. 4) which screws onto the ball screw 28a. The nut 28c is fixed to the camera unit 26. Therefore, the camera unit 26 is able to reciprocate in the X-axis direction within a range set in advance. The camera unit 26 includes a substrate camera 27. The substrate camera 27 is an imaging unit for capturing images of a plurality of fiducial marks or the like of the print substrate W. Moreover, due to the quadruple axes unit 21 of the print stage 20 being movable in the Y-axis direction, the substrate camera 27 is capable of capturing images of a plurality of fiducial marks or the like separated from each other in the X-direction and the Y-direction and recognizing the positions of the fiducial marks or the like.

Referring to FIGS. 2 to 5, a traveling unit 30 is arranged in front of the camera unit 26. The traveling unit 30 includes a supplying unit 40 which supplies applying material, and a print head 60 which rolls the supplied applying material on the mask sheet 3 and which presses the applying material into a pattern.

To mount the traveling unit 30, Y-axis frames 11e are respectively rising on the left and right upper beams 11c of the base 11. The Y-axis frames 11e are structures that extend in the Y-axis direction. Rails 11f are respectively fixed parallel to each other in the Y-axis direction to the upper portions of the Y-axis frames 11e. Sliders 31 of the traveling unit 30 are respectively mounted in pairs on each rail 11f.

Each slider 31 of the traveling unit 30 is capable of moving forward and backward in a stroke range set in advance. Each slider 31 carries a body 32. The body 32 is a structure that integrally includes pillar-bodies 35 respectively provided left and right, and a beam 36 which couples the pillar-bodies 35 with each other in the X-axis direction. The pillar-bodies 35 respectively integrally include a foot portion 35a which is fixed to a corresponding slider 31 and a leg portion 35b which rises from the foot portion 35a.

A ball screw mechanism 37 is coupled to the pillar-body 35 on a downstream side in a substrate conveying direction. The ball screw mechanism 37 includes a ball screw 37a which is rotatably mounted in the Y-axis direction to the Y-axis frame 11e on the downstream side in the substrate conveying direction, a motor 37b which drives the ball screw 37a, and a slider 37c which includes a nut that screws onto the ball screw 37a. The motor 37b rotates the ball screw 37a bi-directionally. In addition, the slider 37c is fixed to the foot portion 35a described earlier. Furthermore, due to control by the control unit 100, when the motor 37b is actuated, the slider 37c moves forward or backward depending on a direction of rotation of the motor 37b. The movement force in the direction is transferred from the foot portion 35a of the pillar-body 35 to the body 32 via the leg portion 35b to enable the body 32 to reciprocate along the rail 11f.

Next, a reinforcing plate 35c is provided between the respective leg portions 35b of the body 32. The reinforcing plate 35c is fixed between a side portion of each pillar-body 35 and a lower surface of the beam 36 and reinforces the body 32. A guide rail 38 which extends in the X-axis direction is fixed to a front surface of the reinforcing plate 35c. The supplying unit 40 is supported by the guide rail 38 via the slider 39. The supplying unit 40 is configured so as to be reciprocable in the X-axis direction due to a ball screw mechanism (not shown) mounted on the body 32.

Next, referring to FIGS. 3 to 5, the supplying unit 40 includes a unit frame 41, a discharge adapter 42 which is detachably mounted to the front of the unit frame 41, a container 43 which is mounted to the discharge adapter 42, and a drive unit 44 which drives the container 43.

The unit frame 41 is mounted to the slider 39 of the guide rail 38. Therefore, the supplying unit 40 is capable of reciprocating in the X-axis direction as a whole.

The discharge adapter 42 includes an annular piston arranged facing upward. A applying material flow channel is vertically formed inside the piston. A shutter 45 is formed at a downstream end of the flow channel. When the shutter 45 is opened, applying material flowed out from the container 43 is discharged downward.

The container 43 is a bottomed cylinder which conforms to the piston of the discharge adapter 42. The container 43 is filled with applying material upon delivery. By inserting the piston of the discharge adapter 42 into an opening of the container 43, the container 43 is coupled so as to be displaceable relative to the discharge adapter 42. In addition, an O ring is provided on an outer circumference of the piston. The O ring secures liquid tightness between the container 43 and the piston of the discharge adapter 42 while allowing relative displacement of the container 43 and the piston of the discharge adapter 42. Furthermore, due to the container 43 being coupled to the discharge adapter 42, the applying material in the container 43 is supplied from the discharge adapter 42. Assembly of the container 43 and the discharge adapter 42 is attachable and detachable to and from the unit frame 41 from a front side of the screen printing machine 10.

The drive unit 44 includes a ball screw mechanism and a pressing member which is vertically driven by the ball screw mechanism, and uses the pressing member to press the container 43 downward and supply the applying material in the container 43 to the discharge adapter 42.

Moreover, since further configurations, operational advantages, and the like of the supplying unit 40 are disclosed in detail in, for example, Japanese Patent Application No. 2009-27310 (Japanese Patent Application Laid-open No. 2010-179628) described earlier, a further description will be omitted.

Next, a print head 60 is mounted to the traveling unit 30 via the lifting unit 50. The print head 60 is arranged on a rear side of the supplying unit 40. Due to the traveling unit 30, the print head 60 reciprocates in the Y-axis direction together with the body 32. In the following description, a movement from front to rear will be assumed to be an advancing movement and a movement in an opposite direction will be assumed to be a retreating movement. In the present embodiment, a direction in which the traveling unit 30 reciprocates is an example of a squeegee-movement direction.

Figure 7:
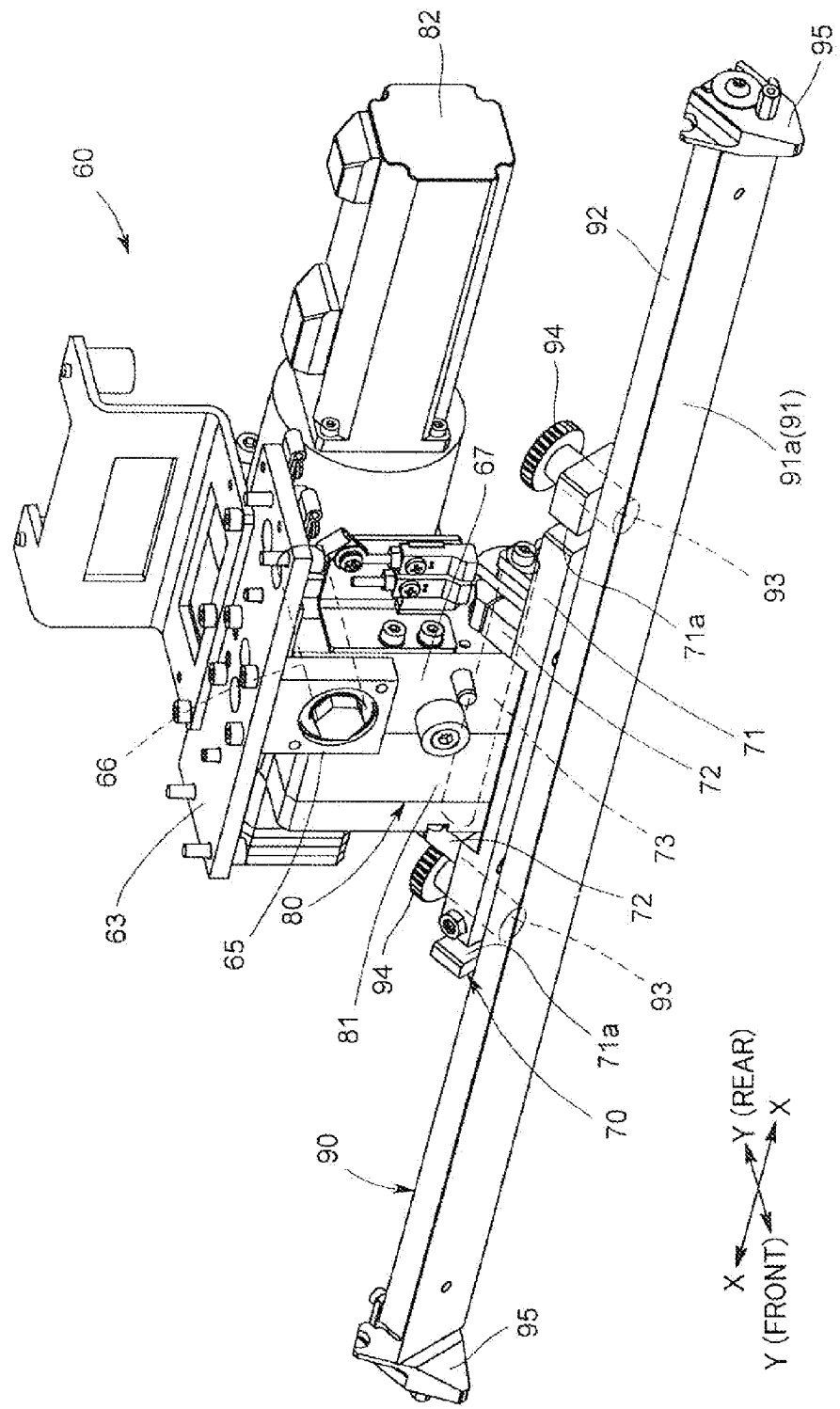
FIG. 7 is a perspective view showing a substantial part of the print head of the screen printing machine.

Referring to FIGS. 6A, 6B, and 7, the print head 60 has a main frame 61 which is made of aluminum or the like. The main frame 61 is guided in the Z-axis direction by a guide rail (not shown) provided on the body 32 of the traveling unit 30. In addition, the lifting unit 50 includes a ball screw mechanism 51 which vertically lifts and lowers the print head 60 via the main frame 61. The ball screw mechanism 51 includes a ball screw 51a which is supported in the Z-axis direction so as to be rotatable around the Z-axis, a motor unit 51b which drives the ball screw 51a, and a nut 51c which screws onto the ball screw 51a. The nut 51c is mounted to the main frame 61. An input pulley 51d is fixed to a head of the ball screw 51a. In addition, the motor unit 51b is coupled to the pulley 51d by a timing belt or the like (not shown) so as to be capable of transferring power to the pulley 51d. Therefore, the print head 60 is vertically lifted or lowered by the lifting unit 50 via the main frame 61. As a result, due to the lifting unit 50, the print head 60 is displaceable between a descending position where a squeegee 91 is abutted on the mask sheet 3 of the screen mask 1 as shown in FIG. 6A, and an ascending position where the print head 60 rises to above the screen mask 1 as shown in FIG. 6B.

Next, the print head 60 will be described in detail.

A support plate 63 is coupled via a sliding post 62 under the main frame 61 of the print head 60 so as to be displaceable in the Z-axis direction. A pressure sensor 64 such as a load cell is arranged between the support plate 63 and the main frame 61.

A pair of bearings 65 is provided at a lower portion (lower surface) of the support plate 63. Each bearing 65 faces along the Y-axis direction. The bearings 65 rotatably support a first support shaft 66 that extends in the Y-axis direction. A subframe 67 is fixed to the first support shaft 66. Accordingly, the sub-frame 67 is swingably supported around the Y-axis.

A unit assembly 70 and a drive mechanism 80 for driving the unit assembly 70 are mounted on the sub-frame 67.

Referring to FIG. 7, the unit assembly 70 includes an assemble plate 71, a pair of coupling protrusions 72 protruding in a midway portion of the assemble plate 71 in a longitudinal direction thereof, and a second support shaft 73 that is fixed to each coupling protrusion 72.

The assemble plate 71 is a rectangular plate-like member that is elongated in the X-axis direction. The coupling protrusions 72 face each other in the X-axis direction across the sub-frame 67. The second support shaft 73 is fixed to the coupling protrusions 72 and, at the same time, rotatably coupled to the sub-frame 67 via a bearing or the like. Therefore, the unit assembly 70 is swingably supported around the X-axis with respect to the sub-frame 67.

The drive mechanism 80 includes a gear box 81 and a servo motor 82. The gear box 81 is fixed to one end (a left side in FIG. 7) of the sub-frame 67. In addition, one end of the pair of coupling protrusions 72 is arranged at one end of the gear box 81. One end of the second support shaft 73 penetrates the gear box 81 and is fixed to the coupling protrusions 72 at the one end of the gear box 81.

A transmission gear (not shown) is fixed to a portion inserted into the gear box 81 among the second support shaft 73. An idle gear (not shown) that is supported inside the gear box 81 meshes with the transmission gear. The servo motor 82 as a drive source is fixed to the other end (a right side in FIG. 7) of the sub-frame 67. The servo motor 82 faces a side surface portion and extends toward an opposite side to the gear box 81 or the other end (the right side in FIG. 7) in the X-axis direction. An output gear of the servo motor 82 is inserted into the gear box 81 and meshes with the idle gear. Accordingly, when the servo motor 82 is actuated, a torque of the servo motor 82 is transmitted to the second support shaft 73 via the respective gears. As a result, the unit assembly 70 is rotationally driven around the second support shaft 73. The servo motor 82, the respective gears, the second support shaft 73, and the like constitute the drive mechanism 80 of the unit assembly 70.

A squeegee unit 90 is detachably assembled onto the unit assembly 70. The squeegee unit 90 includes a squeegee 91 and a squeegee holder 92 that holds the squeegee 91.

The squeegee 91 is a plate-like member that is elongated in the X-axis direction. In order to give the squeegee 91 moderate elasticity, a material of the squeegee 91 is suitably selected from polymeric material such as urethane rubber, polyacetal, polyethylene, and polyester (urethane rubber is adopted in the illustrated embodiment). One surface of the squeegee 91 forms a flat working surface 91a for scraping solder. In addition, another surface of the squeegee 91 acts as a mounting surface to be fixed to the squeegee holder 92.

Similar to the squeegee 91, the squeegee holder 92 is a member that is elongated in the X-axis direction. A pair of bolts 93 is mounted to the squeegee holder 92. The bolts 93 are inserted through a guide groove 71a that is formed in the assemble plate 71 of the unit assembly 70 when the squeegee holder 92 is placed on top of the unit assembly 70. A nut member 94 screws onto each bolt 93. The nut member 94 fastens the unit assembly 70 between the nut member 94 and the squeegee holder 92. Accordingly, the squeegee holder 92 is fixed to the unit assembly 70. A lateral leakage-preventing plate 95 is rotatably mounted to both sides of the squeegee holder 92. The lateral leakage-preventing plate 95 is configured so as to be torsionable relative to the squeegee holder 92 due to the force of a torsion spring (not shown). Therefore, the lateral leakage-preventing plate 95 is held by the squeegee holder 92 so that a center line of the lateral leakage-preventing plate 95 is positioned perpendicular to the working surface 91*a* of the squeegee 91.

As described earlier, with the print head 60 configured in this manner, the main frame 61 is coupled to the traveling unit 30 via the lifting unit 50. Therefore, the squeegee 91 of the print head 60 advances or retreats relative to the screen mask 1 to perform a printing process. Printing performed by an advancing movement of the print head 60 is referred to as "advancing printing" and the opposite is referred to as "retreating printing". With "advancing printing", a printing operation is executed by advancing the squeegee 91, moving a paste reservoir SP that is retained in the front outside-of-print area 3*b* to the rear outside-of-print area 3*c* to roll applying material, and kneading the applying material into the print area 3*a*. In addition, with "retreating printing", a printing operation is executed by moving the print head 60 in a retreating direction from the rear outside-of-print area 3*c* to the front outside-of-print area 3*b* or, in other words, in the Y-axis direction from the rear side to the front side to move the paste reservoir SP retained in the rear outside-of-print area 3*c* to the front outside-of-print area 3*b*.

The servo motor 82 of the drive mechanism 80 rotationally moves the unit assembly 70 by a predetermined amount in accordance with a direction of the squeegee during a printing operation to adjust an attack angle of the squeegee 91. Accordingly, the squeegee 91 is maintained in a lean-forward posture toward the downstream-side in the direction of advancing movement during advancing printing, and toward the downstream-side in the direction of retreating movement during retreating printing. As a result, the squeegee 91 is adjusted to an acute attack angle set in advance. In the illustrated embodiment, the drive mechanism 80 constitutes an angle varying means for varying an attack angle of the squeegee.

The screen printing machine 10 includes the control unit 100 (refer to FIG. 4) for controlling the respective units described above. The control unit 100 is provided with a microprocessor, a memory, and other electronic devices, and logically constitutes a program executing section which executes various programs including printing processes and a data processing section which processes data supplied to the programs. The control unit 100 repetitively performs printing processes by controlling the respective portions of a print apparatus according to a print program stored in advance. In addition, the control unit 100 controls various motors and actuators such as an air cylinder built into the print stage 20 to carry the print substrate W in and out, position the print substrate W relative to the screen mask 1, and the like. In addition, the control unit 100 controls the supplying unit 40 so that applying material is supplied to the screen mask 1. Furthermore, the control unit 100 controls operations of the squeegee 91. The control unit 100 includes a displaying/operating unit. The displaying/operating unit is a unit which displays a progress status, an error message, and the like of the print program and which functions as an interface used by a worker for inputting information such as various data and instructions to the control unit 100. Various sensors are connected to the screen printing machine 10 in order to ensure that operations of the various portions are controlled accurately. The respective sensors are connected to the control unit 100 via an interface (not shown).

Next, a printing operation will be described. In a printing operation, a preparation step is first executed. In the preparation step, a width of the carry-in conveyor in the Y-axis direction, a width between the fixed portion 24*a* and the movable portion 24*b* of the print stage 20 in the Y-axis direction, and a width of the carry-out conveyor in the Y-axis direction are adjusted in accordance with a width of the print substrate W. In addition, after a new screen mask 1 is set by an operator, the frame 2 of the screen mask 1 is fixed to and arranged on the base 11 by the clamp unit 12*b*. Furthermore, the squeegee holder 92 to which is assembled a desired squeegee 91 is assembled to the unit assembly 70. Moreover, applying material is supplied to a surface of the screen mask 1 from the supplying unit 40 and a applying material paste reservoir SP along the X-axis is formed on a surface of the mask sheet 3.

A printing step is executed after the preparation step. In the printing step, the respective portions of the screen printing machine 10 are controlled according to a print program stored in the control unit in advance to execute advancing printing and retreating printing by alternately switching between the two.

After the printing process, the substrate supporting unit 22 of the print stage 20 lowers the print substrate W and once again positions the print substrate W between the carry-in conveyor and the carry-out conveyor. In addition, the print substrate W after printing is carried out from the screen printing machine 10 by operations the reverse to the backup operation and the substrate clamping operation described above.

With the operations described above as one cycle, the screen printing machine 10 repeats the printing operation described above for each of a preset number of print substrates W.

When all printing operations are completed or when the screen mask 1 must be replaced in order to print a print substrate W with a different item number, in the present first embodiment, a rubbing operation of the squeegee 91 is performed at a timing set in advance using functions of the traveling unit 30 and the lifting unit 50.

A more detailed description will now be given with reference to FIGS. 2 and 8. For example, after retreating printing is completed, the squeegee 91 of the print head 60 rises upward as depicted by [OPERATION B] in FIG. 8 from a completion position depicted by [OPERATION A] in FIG. 8, and further moves in the retreating direction to straddle the applying material paste reservoir SP. Next, as depicted by [OPERATION C] in FIG. 8, the squeegee 91 descends in the front outside-of-print area 3*b* that is further forward than the paste reservoir SP. The squeegee 91 then retreats in a state where the squeegee 91 has landed on the mask sheet 3 of the screen mask 1. Due to this retreating operation, excess applying material adhered to the squeegee 91 is removed in the front outside-of-print area 3*b*. Moreover, when necessary, a further rubbing operation may be executed by further lifting the squeegee 91 as depicted by [OPERATION D] in FIG. 8 from a downstream end position of a retreating movement and rotating the squeegee 91 around the second support shaft 73 (refer to FIG. 7) to vary an attack angle thereof, and subsequently lowering the squeegee 91 as depicted by [OPERATION E] in FIG. 8 and advancing the squeegee 91. Due to this scraping operation, excess applying material adhered to the squeegee 91 is scraped off in the front outside-of-print area 3*b* of the mask sheet 3. As a result, there is no longer a risk of the applying material dripping from the squeegee 91. In the first embodiment, a further measure is taken in order to more reliably prevent dripping of the applying material from the squeegee 91. This measure will be described below.

First, referring to FIGS. 9 and 10, a mounting frame 110 is provided on the base 11. A receptacle 120 is held by the mounting frame 110.

Referring now to FIGS. 10A and 10B, the mounting frame 110 includes a frame main body 111 which extends in the X-axis direction. The frame main body 111 is a sheet-metal member that is rectangular in plan view. A total length of the frame main body 111 is set longer by a predetermined length than the frame 2 of the screen mask 1. A front portion of the frame main body 111 is rectangularly notched. The rectangular notched portion is set longer than the frame 2 of the screen mask 1. The frame main body 111 is arranged at a position which is slightly behind the screen mask 1 mounted to the mask mounting area and which faces above the screen mask 1. The receptacle 120 is detachably held on an upper surface of the frame main body 111. Therefore, the screen mask 1 is insertable and removable to the front and rear regardless of the mounting frame 110 and the receptacle 120.

A pair of arms 112 which respectively extend forward is integrally provided at both end portions of the frame main body 111. The arms 112 extend from a rear end to a side portion of the screen mask 1 mounted to the mask mounting area. Each of the arms 112 is fixed to both end portions of the frame main body 111 by an approximately rectangular plate portion 114. In addition, a wall portion 113 is rising from the frame main body 111. The wall portion 113 and the plate portion 114 are structures which support the receptacle 120. Furthermore, protrusions 115 which position the receptacle 120 are respectively provided at both end portions of the frame main body 111.

The receptacle 120 is held at a position facing above the frame 2 of the screen mask 1 mounted to the mask mounting area in a state where the receptacle 120 is position by the wall portion 113 and the protrusions 115 of the plate portion 114. In the illustrated example, the receptacle 120 is made of magnetic stainless steel, and magnets 116 are mounted at appropriate positions of the wall portion 113 and the plate portion 114. Therefore, the receptacle 120 is locked at a home position by the magnetic force of the magnets 116.

The receptacle 120 integrally includes a bottom plate 121 formed rectangular in plan view and wall portions 122 and 123 rising from outer peripheral edges of the bottom plate 121. Sections of the wall portions 122 and 123 near a front end of the bottom plate 121 are set low in order to prevent the wall portions 122 and 123 from interfering with the squeegee 91 and the like.

Figure 8:
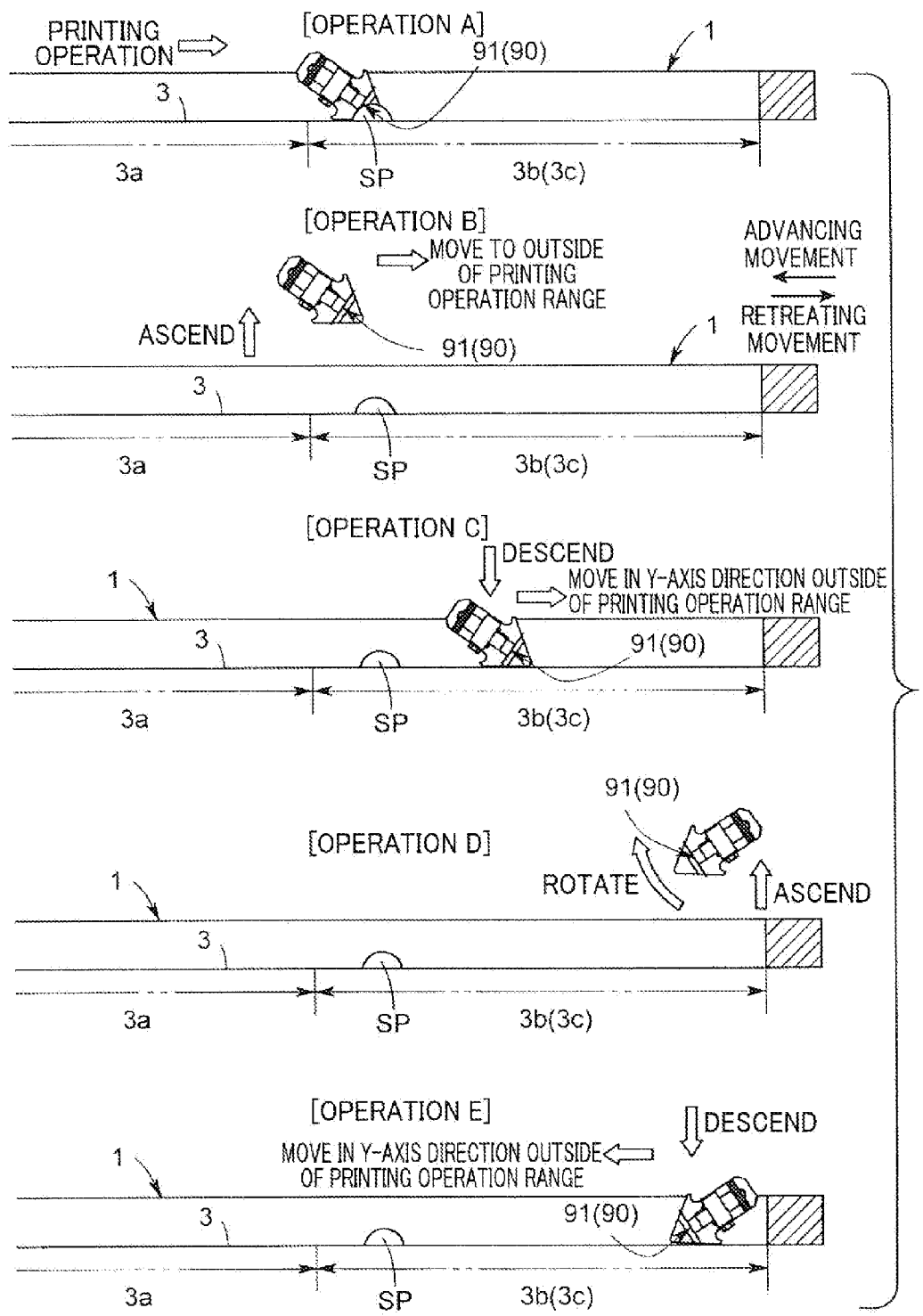
FIG. 8 is a motion diagram showing an operation example of the print head of the screen printing machine.

In the first embodiment, after the rubbing operation shown in FIG. 8 is executed at a required timing, the squeegee 91 is driven to change its posture that is inclined by 75 degrees relative to a horizontal direction. The squeegee 91 is then moved to a position facing an upper portion of the receptacle 120 as shown in FIG. 9.

Next, in the first embodiment, a scraping unit 140 is provided in order to clean the squeegee 91 in a more reliable manner.

Figure 12:
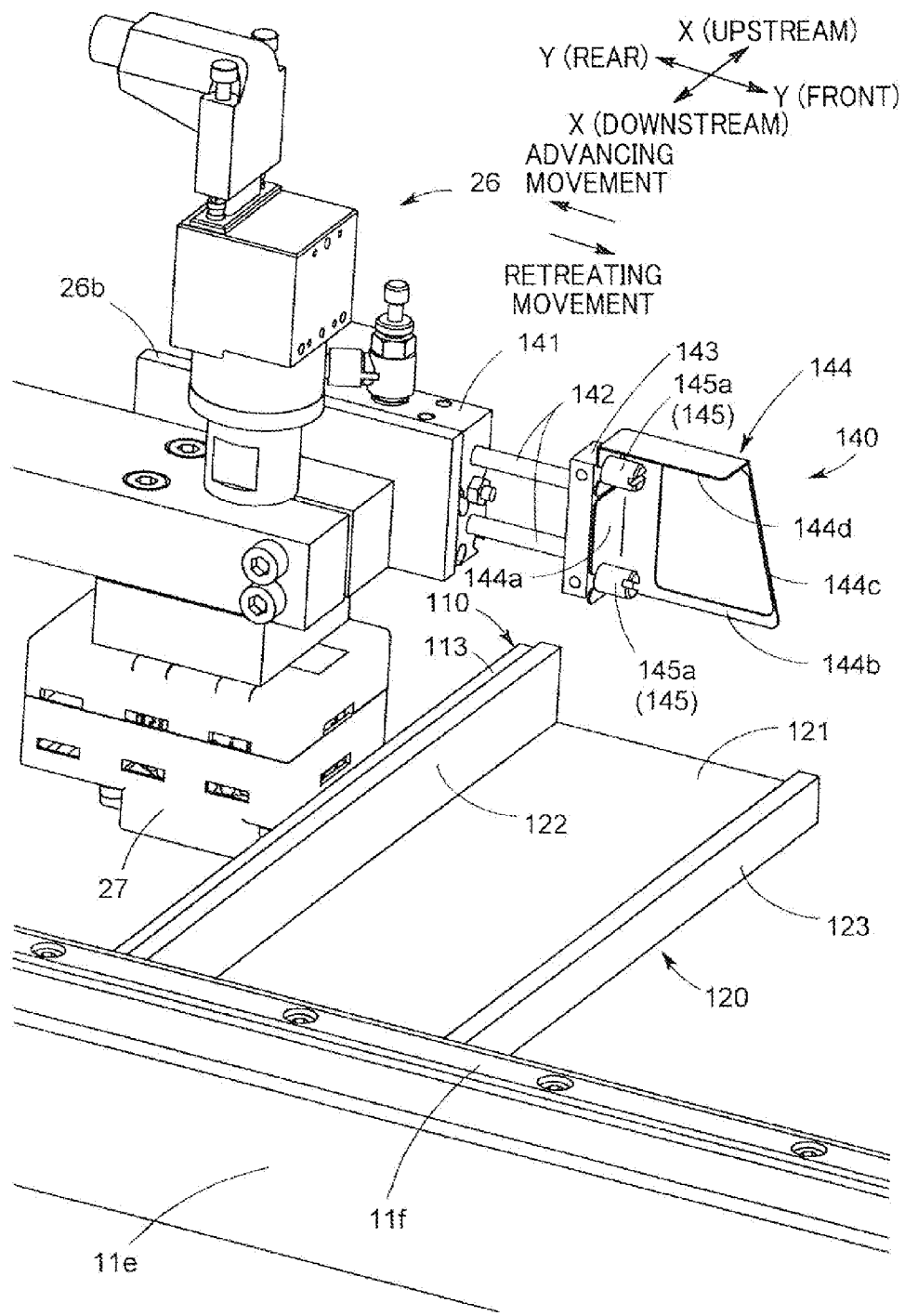
FIG. 12 is a perspective view showing an enlargement of a substantial part of the camera unit.
Figure 13:
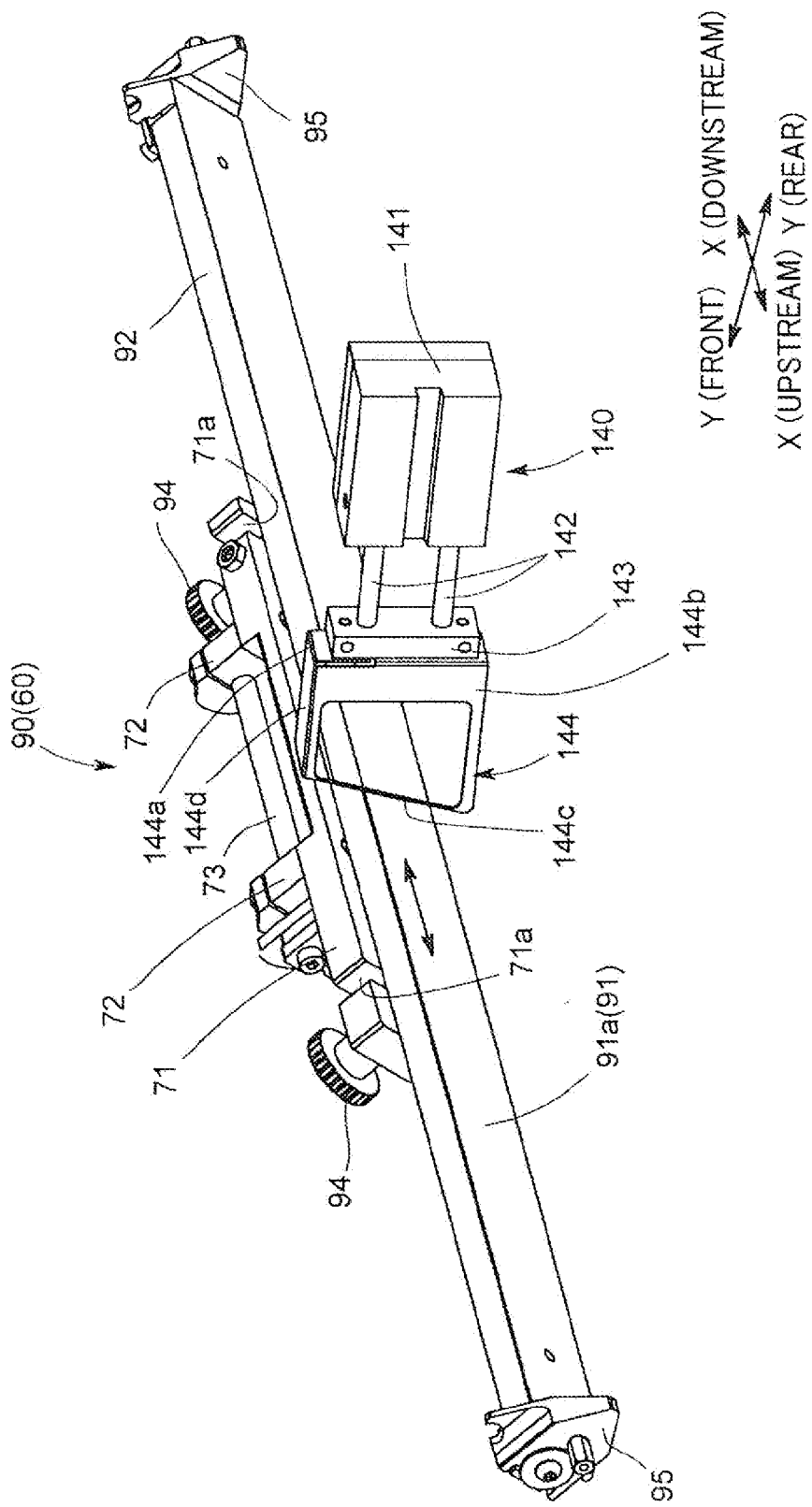
FIG. 13 is a perspective view showing an operation of a scraping unit provided in the camera unit.

Referring to FIGS. 9, 11, and 12, in the first embodiment, the scraping unit 140 is annexed to the camera unit 26. Specifically, the scraping unit 140 includes an air cylinder 141 mounted to a side portion of the substrate camera 27 of the camera unit 26, a mounting member 143 that is driven in the Y-axis direction by a rod 142 of the air cylinder 141, a scraping metal 144 that is detachably mounted to the mounting member 143, and a stud screw 145 that detachably clamps the scraping metal 144 to the mounting member. The air cylinder 141 may be mounted to the stay 26b of the camera unit 26 and orients the rod 142 in the Y-axis direction, for example. The rod 142 may be a pair of upper and lower members, for example. Each rod 142 carries the mounting member 143 which has an approximately plate piece-like shape. The mounting member 143 is formed as a rectangular parallelepiped that extends vertically.

The scraping metal 144 is a sheet-metal member which integrally includes a joining portion 144a that joins a mounting surface (front surface) of the mounting member 143, an arm portion 144b which extends in the Y-axis direction from one end in a width direction (X-axis direction) of the joining portion 144a, a wire portion 144c formed on tips of the arm portion 144b (an opposite side to the joining portion 144a) by providing an opening in the arm portion 144b, and a reinforced portion 144d that is provided so as to extend from an upper end edge of the arm portion 144b.

A pair of slits that open from one end toward the other end is formed in the joining portion 144a. The slits correspond to a pair of upper and lower screw holes formed in the mounting member 143. A screw portion of the stud screw 145 screws into the screw hole. The stud screw 145 includes a knob 145a diameter of which is larger than that of the screw portion, and by grasping the knob 145a, a worker can screw the screw portion into or screw off the screw portion from the screw hole of the mounting member 143 without using any tools. In assemble state, the joining portion 144a is clamped to the mounting member 143 by the stud screw 145. Therefore, the joining portion 144a is detachably held relative to the mounting member 143. Moreover, in the illustrated embodiment, a groove that enables manipulation by a tool is formed in a head of the knob 145a.

The arm portion 144b is a plate member that has an overall trapezoidal shape, and the wire portion 144c on the tip (forward in the Y-axis direction) of the arm portion 144b is inclined by, for example, 75 degrees relative to a horizontal plane in correspondence with an angle of inclination of the squeegee 91. The wire portion 144c has a linear shape that is narrower than the opening formed in the arm portion 144b. During actuation, the wire portion 144c contacts an entire width of the working surface 91a of the squeegee 91 and reciprocates in the X-axis direction relative to the squeegee 91. Due to this operation, the wire portion 144c forcibly scrapes off applying material remaining on the working surface 91a of the squeegee 91 into the receptacle 120 below. In doing so, since the wire portion 144c has a narrow linear shape, the applying material scraped off by the wire portion 144c is more likely to drip downward along the wire portion 144c. Therefore, the applying material is unlikely to adhere to the wire portion 144c.

Due to control by the control unit 100, the air cylinder 141 of the scraping unit 140 is capable of slightly moving back and forth (an oscillating movement) at a scraping position that faces above the receptacle 120. Due to the oscillating movement, applying material adhered to the wire portion 144c is forcibly shaken off into the receptacle 120.

With the configuration described above, the control unit 100 executes a rubbing operation of the squeegee 91 for each lot production, for example. With this rubbing operation, as already described with reference to FIG. 8, applying material adhered to the squeegee 91 is removed from in the front outside-of-print area 3b or the rear outside-of-print area 3c set on the mask sheet 3 of the screen mask 1. Subsequently, the control unit 100 moves the print head 60 and causes the squeegee 91 to face above the receptacle 120. The scraping metal 144 of the scraping unit 140 faces above the receptacle 120. When necessary, the control unit 100 actuates the motor 28b of the ball screw mechanism 28 that drives the camera unit 26. Accordingly, the wire portion 144c of the scraping metal 144 can slide in the X-axis direction relative to the squeegee 91 in a state where the wire portion 144c contacts the working surface 91a of the squeegee 91. Due to this scraping operation, applying material remaining on the working surface 91a of the squeegee 91 is reliably scraped off. The scraped-off applying material is reliably collected inside the receptacle 120. Therefore, there is no risk of the applying material scattering and soiling the inside of the screen printing machine 10.

In another mode, after a printing operation is completed, the rubbing operation (FIG. 8) may be omitted and the squeegee 91 may be immediately moved to above the receptacle 120 to execute a scraping operation.

An operator can execute replacement work of the screen mask 1 once the squeegee 91 moves to the receptacle 120. In this case, since the replacement work of the screen mask 1 is executed in parallel to cleaning work of the squeegee 91, preparation time can be reduced dramatically. Moreover, dripping of the applying material remaining on the squeegee 91 may be promoted by changing an attack angle of the squeegee 91 to the vicinity of 90 degrees (for example, to 75 degrees) during the movement of the squeegee 91 to above the receptacle 120.

Second Embodiment

Figure 14:
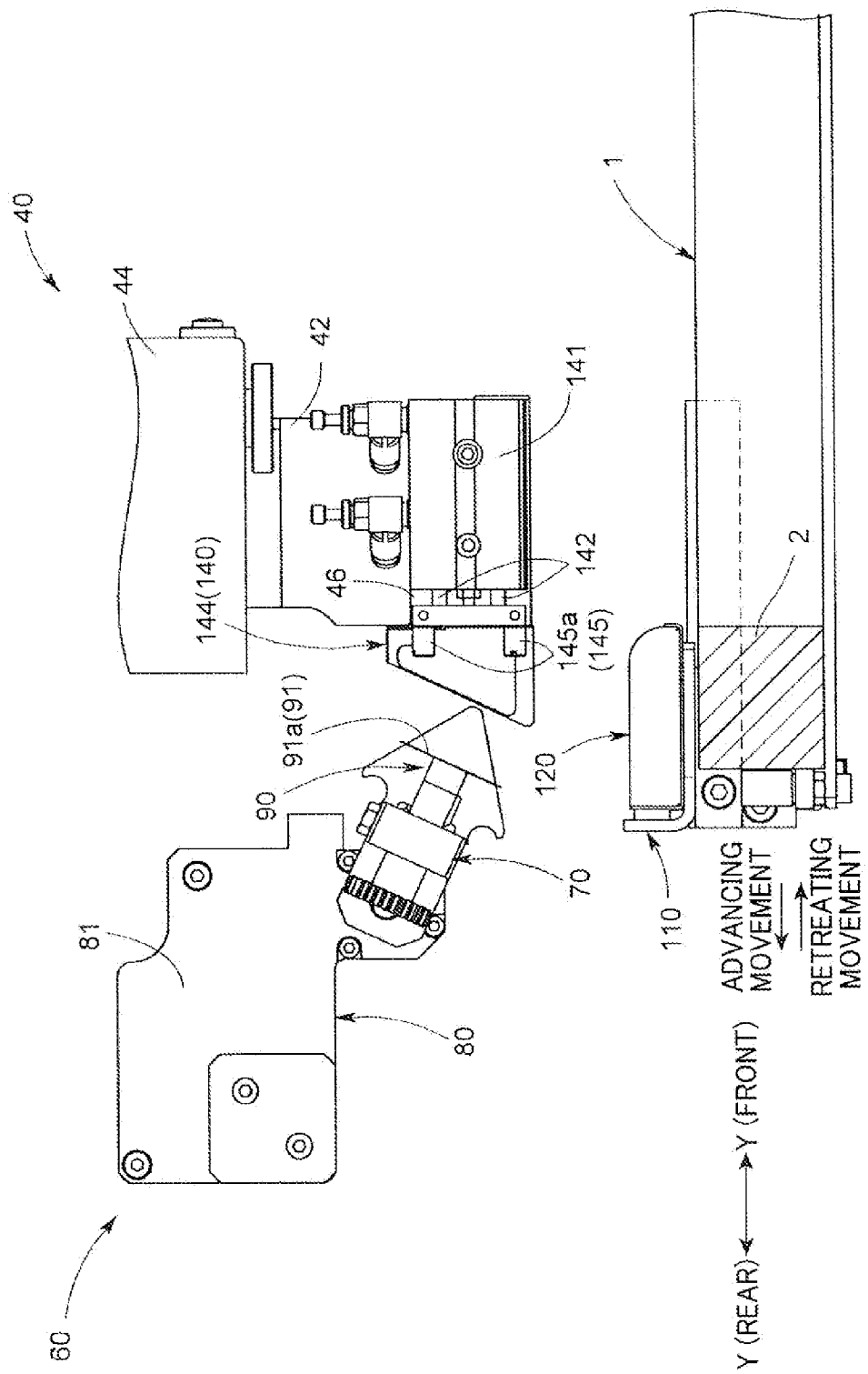
FIG. 14 is a partial enlarged schematic side view showing a substantial part of a screen printing machine according to a second embodiment of the present invention.
Figure 15:
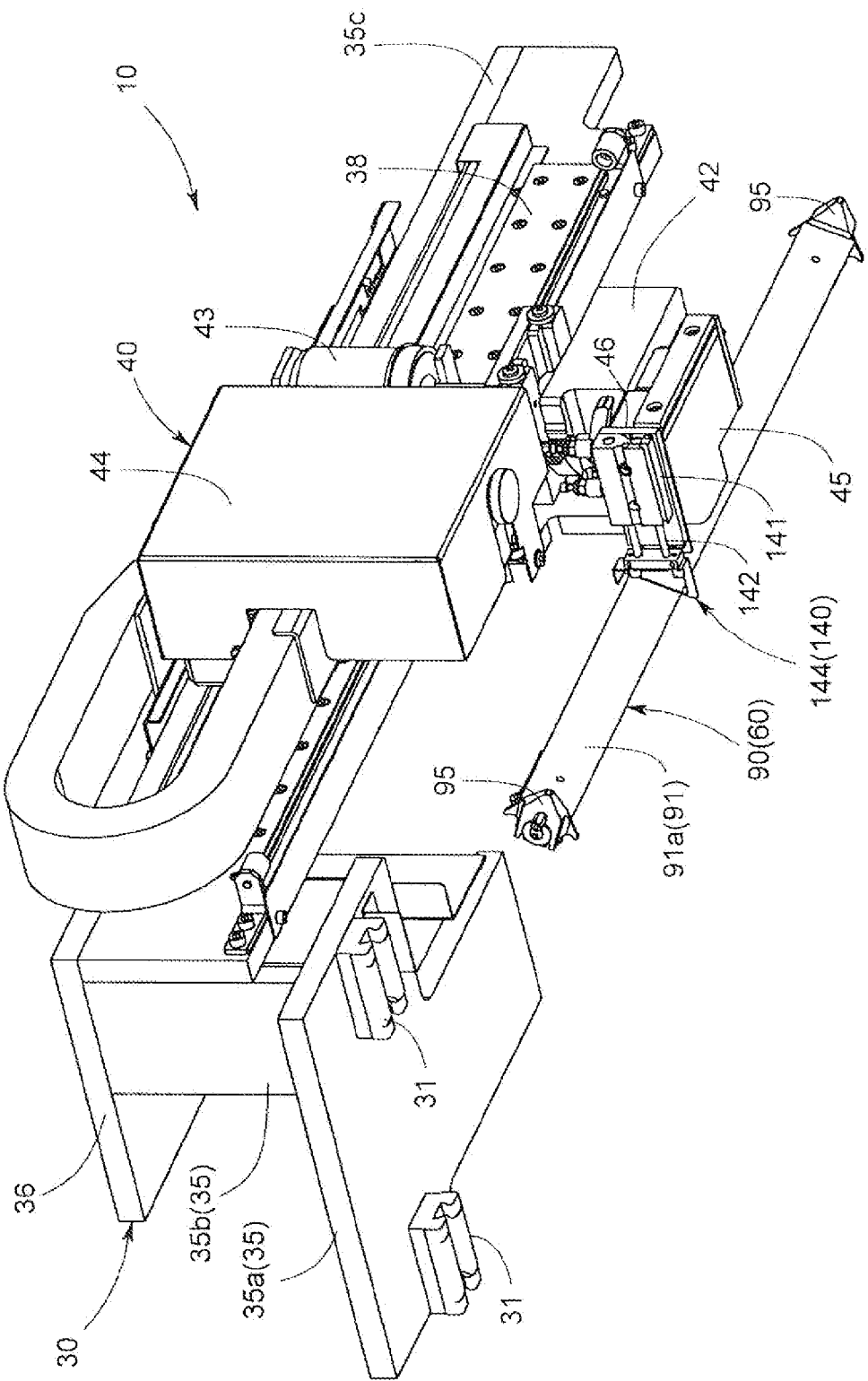
FIG. 15 is a perspective view showing a substantial part of the screen printing machine according to the second embodiment.

Next, a second embodiment will be described with reference to FIGS. 14 and 15.

As shown in the drawings, in the second embodiment, a scraping unit 140 is mounted to a supplying unit 40. A stay 46 is annexed to a discharge adapter 42 of the supplying unit 40 according to the second embodiment, and an air cylinder 141 of the scraping unit 140 is mounted to the stay 46. A rod 142 of the air cylinder 141 faces a squeegee 91 from front to rear. Since the supplying unit 40 and a print head 60 are mounted to a traveling unit 30, the supplying unit 40 and the print head 60 integrally move in a Y-axis direction. Therefore, an interval across which the squeegee 91 and (a wire portion 144c of) scraping metal 144 of the scraping unit 140 face each other is set to an interval that does not obstruct a rotational movement of the squeegee 91. At the same time, the rod 142 of the air cylinder 141 of the scraping unit 140 is set so as to be displaceable between a retreat position (a position shown in FIG. 14) where the scraping metal 144 allows a rotational movement of the squeegee 91 and a sliding-contact position (a position shown in FIG. 15) where the scraping metal 144 joins a working surface 91a of the squeegee 91.

Otherwise, the second embodiment is similar to the first embodiment.

Even in the second embodiment, a cleaning operation of the squeegee 91 by the scraping unit 140 can be executed at a desired timing.

Third Embodiment

Next, a third embodiment will be described.

In the third embodiment, a double squeegee-type print head including two squeegees 91A and 91B is adopted as the print head 160.

With the double squeegee-type print head 160, an advancing unit 160A that is used for advancing printing and a retreating unit 160B that is used for retreating printing are mounted to a same main frame 161. The respective units 160A and 160B include lifting units 162A and 162B and are configured so as to be capable of vertically lifting and lowering squeegee assembly portions 163A and 163B. The respective squeegee assembly units 163A and 163B carry the squeegees 91A and 91B at attack angles appropriate to respectively corresponding directions of movement. When executing advancing printing, the squeegee 91A of the advancing unit 160A is lowered while the squeegee 91B of the retreating unit 160B is lifted and the traveling unit advances. In addition, when executing retreating printing, the squeegee 91A of the advancing unit 160A is lifted while the squeegee 91B of the retreating unit 160B is lowered and the traveling unit retreats.

Depending on a printing operation, the control unit 100 selectively controls the advancing unit 160A and the retreating unit 160B. At the same time, during a required squeegee cleaning operation, the control unit 100 can lift or lower the squeegees 91A and 91B of both units 160A and 160B to supply the squeegees 91A and 91B to a scraping unit 240.

The scraping unit 240 according to the third embodiment includes scraping metal 241 corresponding to the double squeegee-type print head 160. The scraping metal 241 includes an advancing wire portion 241a that inclines in accordance with an angle of the advancing squeegee 91A and a retreating wire portion 241b that inclines in accordance with an angle of the retreating squeegee 91B. The advancing wire portion 241a and the retreating wire portion 241b are arranged so as to be left-right symmetrical and are set to specifications that allow the advancing wire portion 241a and the retreating wire portion 241b to simultaneously come into to sliding contact with the squeegee 91A of the advancing unit 160A and the squeegee 91B of the retreating unit 160B when both squeegees 91A and 91B are at a same height.

Figure 16:
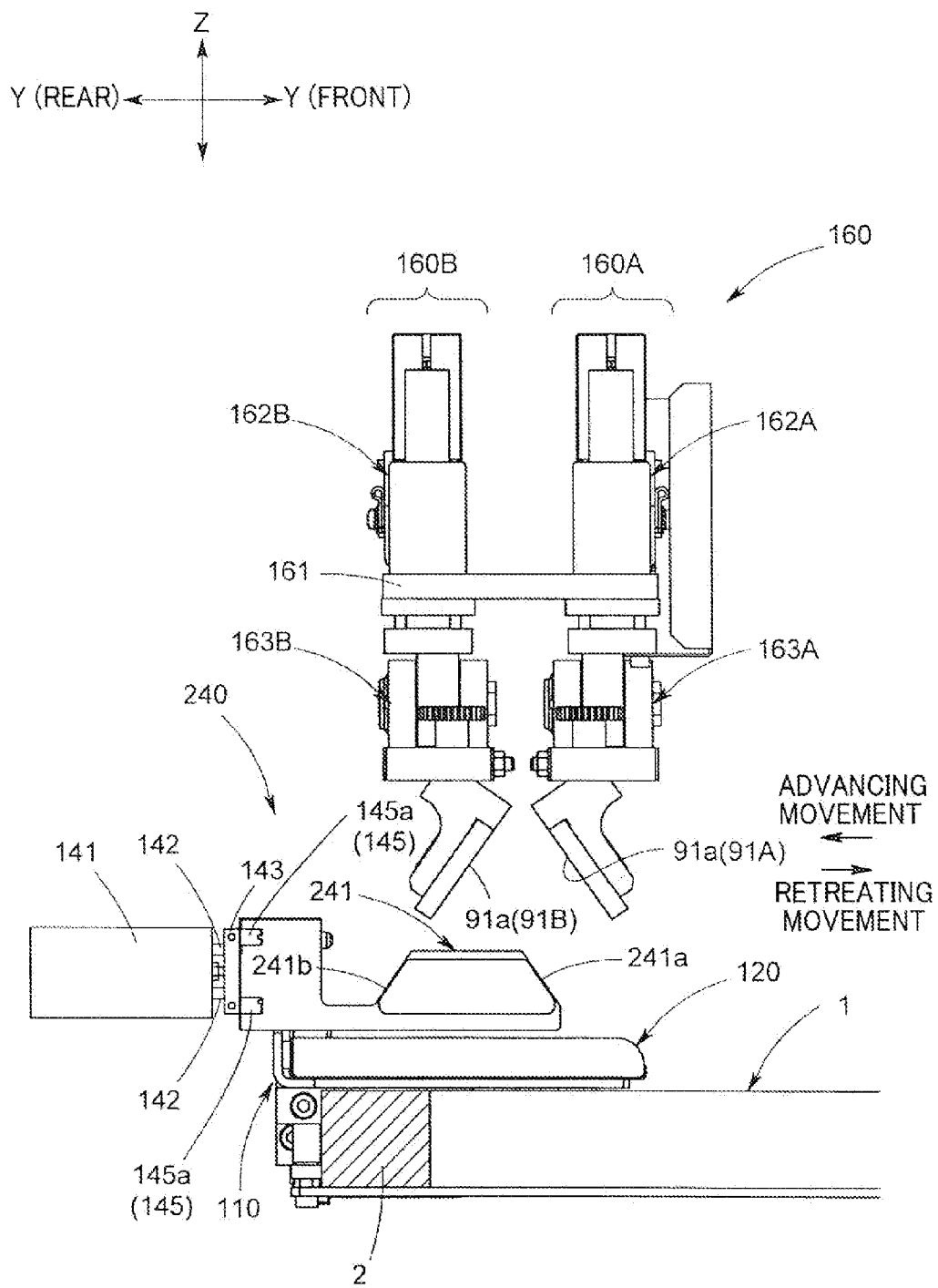
FIG. 16 is a partial enlarged schematic side view showing a substantial part of a screen printing machine according to a third embodiment of the present invention.
Figure 17:
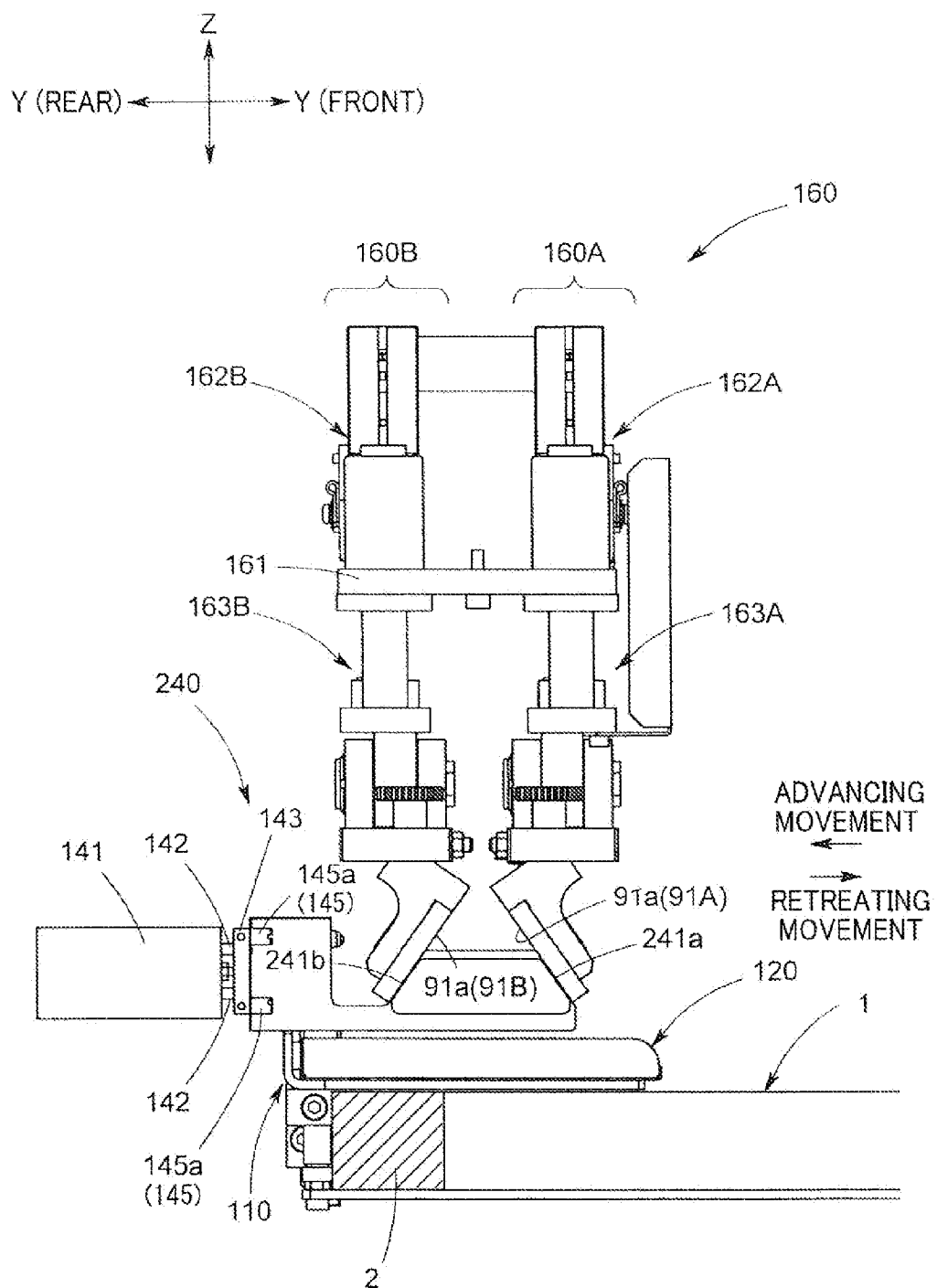
FIG. 17 is a partial enlarged schematic side view showing an operation of the screen printing machine according to the third embodiment.

As a result, as shown in FIG. 16, by first adjusting the squeegee 91A of the advancing unit 160A and the squeegee 91B of the retreating unit 160B to a same height and having the squeegees 91A and 91B face above the scraping metal 241 and subsequently lowering the squeegees 91A and 91B of both units 160A and 160B, both squeegees 91A and 91B come into sliding contact with respectively corresponding wire portions 241a and 241b as shown in FIG. 17. By driving the scraping unit 240 in the X-axis direction in this state, the scraping metal 241 moves relative to both squeegees 91A and 91B. Consequently, applying material adhered to the working surfaces 91a of both squeegees 91A and 91B is forcibly scraped off by the wire portions 241a and 241b and collected in a receptacle 120.

The scraping unit 240 may be mounted to a camera unit in a similar manner to the first embodiment or mounted to a supplying unit in a similar manner to the second embodiment.

As shown in FIGS. 16 and 17, the third embodiment is also provided with the receptacle 120. Reflecting the fact that the print head 160 is a double squeegee-type print head, the receptacle 120 according to the third embodiment is set to specifications (in particular, dimensions in the Y-axis direction) that allow both the advancing unit 160A and the retreating unit 160B to simultaneously face the receptacle 120 from above. Accordingly, when the applying material adhered to the working surfaces 91a of both squeegees 91A and 91B is forcibly scraped off by the wire portions 241a and 241b, the receptacle 120 can reliably collect the applying material.

In the third embodiment, a program of a control unit enables both squeegees 91A and 91B to execute a rubbing operation of the screen mask 1.

Figure 18:
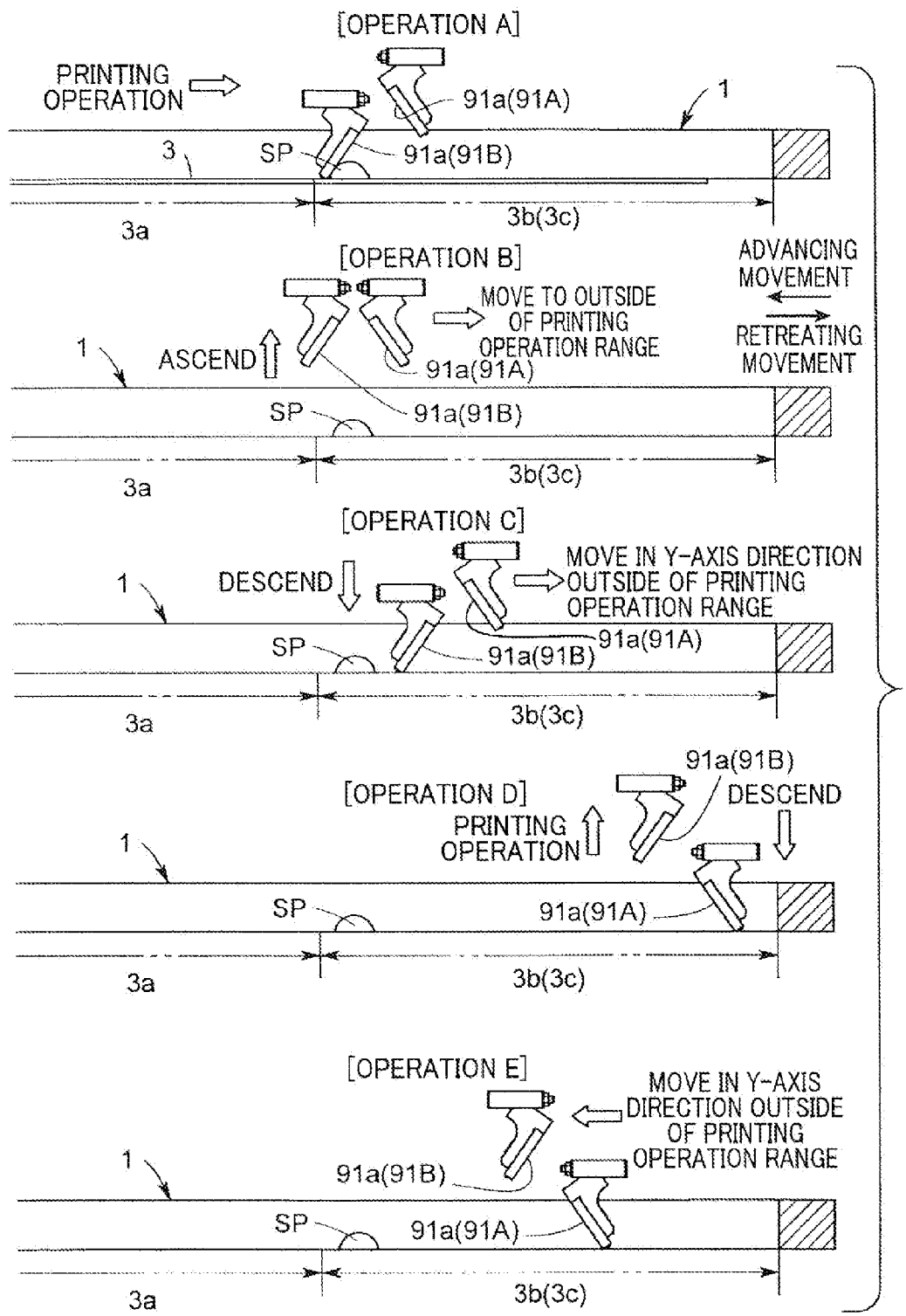
FIG. 18 is a motion diagram showing an operation example of a print head of the screen printing machine according to the third embodiment.

A more detailed description will now be given with reference to FIG. 18. For example, when executing retreating printing, the squeegee 91B of the retreating unit 160B rises upward as depicted by [OPERATION B] in FIG. 18 after the retreating printing is completed from a completion position depicted by [OPERATION A] in FIG. 18. Next, the print head 160 retreats as a whole and straddles a applying material paste reservoir SP. Subsequently, as depicted by [OPERATION C] in FIG. 18, the squeegee 91B of the retreating unit 160B descends in the front outside-of-print area 3b that is further forward than the paste reservoir SP. The squeegee 91B of the retreating unit 160B then retreats in a state where the squeegee 91B is landed on the mask sheet 3 of the screen mask 1. Due to this retreating operation, excess applying material adhered to the squeegee 91B of the retreating unit 160B is removed in the front outside-of-print area 3b. Moreover, when necessary, a further rubbing operation may be executed by lifting the squeegee 91B of the retreating unit 160B from a downstream-end position of a retreating movement while lowering the squeegee 91A of the advancing unit 160A as depicted by [OPERATION D] in FIG. 18 and then advancing the squeegee 91A as depicted by [OPERATION E] in FIG. 18. Due to this rubbing operation, excess applying material adhered to the squeegee 91A of the advancing unit 160A is also removed in the front outside-of-print area 3b of the mask sheet 3. As a result, there is no longer a risk of the applying material dripping from both squeegees 91A and 91B.

As described above, in the respective embodiments according to the present invention, attachment/detachment work of the screen mask 1 can be executed while catching applying material that may drip down from the squeegees 91, 91A, and 91B into the receptacle 120 when attaching or detaching the screen mask 1. Therefore, the applying material adhered to the squeegees 91, 91A, and 91B does not involuntarily drip into the mask mounting area during attaching or detaching of the screen mask 1. In addition, treatment of the applying material after catching can be performed more easily. Furthermore, the catching of applying material is executed at a location so that the screen mask is allowed to be attached and detached 1. Therefore, replacement work of the screen mask 1 can be executed while catching the applying material on the squeegees 91, 91A, and 91B into the receptacle 120. As a result, the screen mask 1 can be replaced while leaving the squeegees 91, 91A, and 91B mounted. Accordingly, attachment/detachment work during replacement of the screen mask 1 is dramatically simplified and preparation work becomes easier. In addition, the versatility of the squeegees 91, 91A, and 91B can be effectively utilized.

Furthermore, in the respective embodiments, the receptacle 120 is detachably fixed to a location so that the screen mask 1 is allowed to be attached and detached. Therefore, in the respective embodiments, since maintenance work can be performed by removing the receptacle 120, maintainability can also be improved.

In addition, the respective embodiments further include a mounting frame 110 on which the receptacle 120 is mounted. The receptacle 120 is formed of a magnetic body, and the mounting frame 110 further includes a magnet 116 for locking the receptacle 120 to a catching area. Therefore, in the respective embodiments, the receptacle 120 can be detachably supported by the magnet 116. Accordingly, handling of the receptacle 120 becomes easier.

In the respective embodiments, the screen mask 1 is so that a worker is allowed to insert and remove it at a front side (at one end) in the Y-axis direction, and the receptacle 120 is installed at a rear side (at the other end) in the Y-axis direction at a retreating position of the squeegees 91, 91A, and 91B. Therefore, in the respective embodiments, the worker can insert and remove the screen mask 1 on the front side in the Y-axis direction. During screen replacement, the squeegees 91, 91A, and 91B retreat to a side opposite to the worker or, in other words, to the rear side in the Y-axis direction. Therefore, the worker can perform work to insert and remove the screen mask 1 at a location that is furthest from the squeegees 91, 91A, and 91B. Accordingly, the worker can readily execute replacement work of the screen mask 1 without being distracted by the squeegees 91, 91A, and 91B.

Furthermore, the respective embodiments further include a lifting unit 50 that vertically drives the squeegees 91, 91A, and 91B, a traveling unit 30 which causes the squeegees 91, 91A, and 91B to reciprocate in respective Y-axis directions thereof via the lifting unit 50, and a control unit 100 which controls the lifting unit 50 and the traveling unit 30 so that the squeegees 91, 91A, and 91B face above the receptacle 120 during replacement of the screen mask 1. Therefore, in the respective embodiments, due to control by the control unit 100, replacement work of the screen mask 1 can be executed while moving the squeegees 91, 91A, and 91B to above the receptacle 120 in order to avoid dripping of applying material. In particular, when the screen mask 1 is provided so that a worker can insert and remove the screen mask 1 on a front side (at one end) in the Y-axis direction and the receptacle 120 is provided at a position where the squeegees 91, 91A, and 91B retreat on a rear side (at the other end) in the Y-axis direction, the worker can execute replacement work of the screen mask 1 while completely ignoring the squeegees 91, 91A, and 91B. Therefore, workability can be improved.

In the respective embodiments, the control unit 100 controls the lifting unit 50 and the traveling unit 30 so that the squeegees 91, 91A, and 91B slide outside of a print area on the screen mask 1 after completion of a printing operation and allows the squeegee to move subsequently s 91, 91A, and 91B move to above the receptacle 120. Therefore, in the respective embodiments, excess applying material can be scraped off outside of the print area in the screen mask 1 before moving the squeegees 91, 91A, and 91B to above the receptacle 120. As a result, the applying material can be prevented from dripping during movement of the squeegees 91, 91A, and 91B.

Furthermore, in the first and second embodiments: the squeegee 91 is a single plate member of which attack angle is varied in accordance with the Y-axis direction; a gear box 81, a servo motor 82, a second support shaft 73, and the like are further provided as angle varying means for varying the attack angle of the squeegee 91; and the control unit 100 controls a drive mechanism 80 as angle varying means so that the squeegee 91 inclines at a vertical angle or an angle in the vicinity of the vertical angle (for example, 75 degrees) during replacement of the screen mask 1. Therefore, in the respective embodiments, when the squeegee 91 retreats to above the receptacle 120 during replacement of the screen mask 1, applying material is more likely to drip from the squeegee 91 and catching is promoted.

In the third embodiment, the squeegees 91A and 91B are constituted by an advancing squeegee 91A which slidingly contacts the screen mask 1 during an advancing movement, and a retreating squeegee 91B which slidingly contacts the screen mask 1 during a retreating movement when reciprocating in the Y-axis direction, and the receptacle 120 is set to specifications which enable the receptacle 120 to face both the advancing squeegee 91A and the retreating squeegee 91B. Therefore, even when a so-called double squeegee-type print head is adopted, dripping of applying material from both squeegees 91A and 91B can be prevented.

In the respective embodiments described above, the receptacle 120 may be formed of a disposable material. Suitable disposable material includes paper and plastic. In this case, since caught applying material can be treated by replacing the receptacle 120, handling of the receptacle 120 and the applying material becomes easier.

It is to be understood that the present invention is not limited to the embodiments described above and that various modifications may be made without departing from the spirit or scope of the present invention.

This application is based on Japanese Patent Application Serial No. 2012-162731, filed in Japan Patent Office on Jul. 23, 2012, the contents of which are hereby incorporated by reference.

What is claimed is:

1. A screen printing machine that prints applying material on a substrate, comprising:
   a screen mask detachably mounted to a mask mounting area set in advance;
   a squeegee arranged above the screen mask mounted to the mask mounting area, the squeegee being configured to reciprocate relative to the screen mask in a squeegee-movement direction set in advance; and
   a receptacle installed at a location so that the screen mask is allowed to be attached and detached, the receptacle being configured to catch applying material dripped from the squeegee,
   wherein the screen mask includes a frame with four corners;
   the screen mask is configured to be mounted at the screen mounting area so that a worker is allowed to insert and remove the screen mask at one end in the squeegee-movement direction;
   the frame has a frame part extending along a direction perpendicular to the squeegee-movement direction, the frame part being configured to be placed at a same end in the squeegee-movement direction when the screen mask is mounted to the mask mounting area;
   the receptacle is held at a position exactly above the frame part of the screen mask mounted to the mask mounting area and facing the squeegee;
   the squeegee is configured to move to an other end of the squeegee-movement direction such that, when the screen mask is inserted/removed, the squeegee is able to be retreated to the position where the squeegee faces an upper portion of the receptacle so that the receptacle catches the applying material dripped from the squeegee.

2. The screen printing machine according to claim 1, wherein the receptacle is detachably fixed at a location so that the screen mask is allowed to be attached and detached.

3. The screen printing machine according to claim 2, further comprising a mounting frame on which the receptacle is mounted,
   wherein:
   the receptacle is formed of a magnetic body; and
   the mounting frame further includes a magnet for locking the receptacle.

4. The screen printing machine according to claim 1, further comprising:
   a lifting unit that vertically drives the squeegee;
   a traveling unit which causes the squeegee to reciprocate in the squeegee-movement direction via the lifting unit; and
   a control unit that controls the lifting unit and the traveling unit so that the squeegee faces above the receptacle during replacement of the screen mask.

5. The screen printing machine according to claim 4,
   wherein the control unit controls the lifting unit and the traveling unit so that the squeegee slides outside of a print area on the screen mask after completion of a printing operation and subsequently allows the squeegee to move to above the receptacle.

6. The screen printing machine according to claim 4,
   wherein the squeegee is a single plate,
   the screen printing machine further comprises a unit assembly holding the squeegee, the unit assembly being configured to be swingably supported around an axis around which an attack angle of the squeegee is defined so that the attack angle of the squeegee is changeable, and an angle varying unit for varying the attack angle of the squeegee through the unit assembly, and
   wherein the control unit controls the angle varying unit so that the squeegee is inclined at a vertical angle to an angle in a vicinity of the vertical angle during replacement of the screen mask.

7. The screen printing machine according to claim 1,
   wherein the receptacle is formed of a disposable material.

8. The screen printing machine according to claim 1, wherein:
   the squeegee is constituted by an advancing squeegee which slidingly contacts the screen mask during an advancing movement, and a retreating squeegee which slidingly contacts the screen mask during a retreating movement when reciprocating in the squeegee-movement direction.

9. The screen printing machine according to claim 8,
   wherein the receptacle is formed of a disposable material.

* * * * *